United States Patent
Chang et al.

(10) Patent No.: US 11,018,005 B2
(45) Date of Patent: May 25, 2021

(54) PATTERNING METHOD AND PATTERNED STRUCTURE

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Fujian Province (CN)

( * ) Notice: Subject to any disclaimer, the term of this patent is extended or adjusted under 35 U.S.C. 154(b) by 65 days.

(21) Appl. No.: 15/956,722

(22) Filed: Apr. 18, 2018

(65) Prior Publication Data
US 2019/0295840 A1  Sep. 26, 2019

(30) Foreign Application Priority Data
Mar. 23, 2018 (CN) .......................... 201810243170.0

(51) Int. Cl.
H01L 21/027 (2006.01)
H01L 21/311 (2006.01)
H01L 21/768 (2006.01)
H01L 21/033 (2006.01)

(52) U.S. Cl.
CPC ...... H01L 21/0271 (2013.01); H01L 21/0337 (2013.01); H01L 21/31144 (2013.01); H01L 21/76816 (2013.01)

(58) Field of Classification Search
CPC ............................................ H01L 21/0271
See application file for complete search history.

(56) References Cited

U.S. PATENT DOCUMENTS

| | | | |
|---|---|---|---|
| 9,627,201 B2 | 4/2017 | Nam | |
| 9,627,202 B2 | 4/2017 | Ha | |
| 9,653,294 B2 | 5/2017 | Kim | |
| 2002/0050645 A1* | 5/2002 | Huang | H01L 21/76829 257/758 |
| 2013/0337650 A1* | 12/2013 | Lee | H01L 21/76811 438/702 |
| 2014/0349476 A1* | 11/2014 | Chen | H01L 23/485 438/620 |
| 2015/0061087 A1 | 3/2015 | Hong | |
| 2015/0243525 A1 | 8/2015 | Park | |

FOREIGN PATENT DOCUMENTS

| | | |
|---|---|---|
| CN | 101112789 A | 1/2008 |
| CN | 101571246 A | 11/2009 |
| CN | 104157654 A | 11/2014 |

* cited by examiner

*Primary Examiner* — Mohammad M Choudhry
(74) *Attorney, Agent, or Firm* — Winston Hsu

(57) ABSTRACT

A patterning method includes the following steps. A mask layer is formed on a material layer. A first hole is formed in the mask layer by a first photolithography process. A first mask pattern is formed in the first hole. A second hole is formed in the mask layer by a second photolithography process. A first spacer is formed on an inner wall of the second hole. A second mask pattern is formed in the second hole after the step of forming the first spacer. The first spacer surrounds the second mask pattern in the second hole. The mask layer and the first spacer are removed. The pattern of the first mask pattern and the second mask pattern are transferred to the material layer by an etching process.

19 Claims, 27 Drawing Sheets

PATTERNING METHOD AND PATTERNED STRUCTURE

BACKGROUND OF THE INVENTION

1. Field of the Invention

The present invention relates to a patterning method and a patterned structure, and more particularly, to a patterning method including photolithography processes and a patterned structure formed by the patterning method.

2. Description of the Prior Art

Integrated circuit (IC) is constructed by devices and interconnections, which are formed by patterned feature in the substrate or different layers. In the fabrication of IC, the photolithography process is an essential technique. The photolithography process is configured to form designed patterns such as circuit layout patterns on one or more photomasks, and then to precisely transfer such patterns to a photoresist layer on a film by exposure and development steps. Subsequently, the complicated layout patterns are precisely transferred to a semiconductor chip.

With the miniaturization development in the semiconductor industry and the progress in semiconductor fabrication technology, the widely used conventional exposure techniques are gradually approaching their limits. Therefore, at present, the industry has also developed double exposure lithography technology or multiple exposure lithography technology to make more miniaturized semiconductor device structure. However, different photolithography processes and/or more complicated manufacturing method are required for forming patterned structures disposed in the same layer and disposed in different regions respectively because of the different shapes, the different dimensions, and/or the different densities. The manufacturing process becomes more complicated and the manufacturing cost is increased accordingly.

SUMMARY OF THE INVENTION

A patterning method and a patterned structure are provided in the present invention. A pattern of a patterned structure going to be formed is divided into layout combinations, and photolithography processes are applied to form the required mask patterns for overcoming problems in manufacturing the patterned structure with pattern spacing smaller than the exposure resolution.

According to an embodiment of the present invention, a patterned structure is provided. The patterned structure includes a plurality of first sub patterns, a plurality of second sub patterns, and a plurality of third sub patterns. The first sub patterns are arranged in a first direction and a second direction, and the first sub patterns are arranged in the first direction by a first pitch. The second sub patterns are arranged in the first direction and the second direction, and the second sub patterns are arranged in the first direction by a second pitch. The third sub patterns are arranged in the first direction and the second direction, and the third sub patterns are arranged in the first direction by a third pitch. The first pitch, the second pitch, and the third pitch are equal to one another. One of the second sub patterns and one of the third sub patterns are disposed between two of the first sub patterns adjacent to each other in the first direction. A first smallest distance exists between one of the first sub patterns and one of the second sub patterns in the first direction, a second smallest distance exists between one of the second sub patterns and one of the third sub patterns in the first direction, and a third smallest distance exists between one of the first sub patterns and one of the third sub patterns in the first direction. At least two selected from the group consisting of the first smallest distance, the second smallest distance, and the third smallest distance are different from one another.

According to an embodiment of the present invention, a patterning method is provided. The patterning method includes the following steps. First, a mask layer is formed on a material layer. A first hole is formed in the mask layer by a first photolithography process. A first mask pattern is formed in the first hole. A second hole is formed in the mask layer by a second photolithography process. A first spacer is formed on an inner wall of the second hole. A second mask pattern is formed in the second hole after the step of forming the first spacer, and the first spacer surrounds the second mask pattern in the second hole. The mask layer and the first spacer are removed. The pattern of the first mask pattern and the second mask pattern is transferred to the material layer by an etching process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-24 are schematic drawings illustrating a patterning method according to the first embodiment of the present invention, wherein FIG. 3 is a flow chart;

FIG. 4 is a cross-sectional diagram of a first region and a second region;

FIG. 5 is a top view schematic drawing illustrating the first region in FIG. 4;

FIG. 6 is a top view schematic drawing illustrating the second region in FIG. 4;

FIG. 7 is a schematic drawing in a step subsequent to FIG. 4;

FIG. 8 is a schematic drawing in a step subsequent to FIG. 7;

FIG. 9 is a schematic drawing in a step subsequent to FIG. 8;

FIG. 10 is a top view schematic drawing illustrating the first region in FIG. 9;

FIG. 11 is a top view schematic drawing illustrating the second region in FIG. 9;

FIG. 12 is a schematic drawing in a step subsequent to FIG. 9;

FIG. 13 is a schematic drawing in a step subsequent to FIG. 12;

FIG. 14 is a schematic drawing in a step subsequent to FIG. 13;

FIG. 15 is a top view schematic drawing illustrating the first region in FIG. 14;

FIG. 16 is a top view schematic drawing illustrating the second region in FIG. 14;

FIG. 17 is a schematic drawing in a step subsequent to FIG. 14;

FIG. 18 is a schematic drawing in a step subsequent to FIG. 17;

FIG. 19 is a top view schematic drawing illustrating the first region in FIG. 18;

FIG. 20 is a top view schematic drawing illustrating the second region in FIG. 18;

FIG. 21 is a schematic drawing in a step subsequent to FIG. 18;

FIG. 22 is a top view schematic drawing illustrating the first region in FIG. 21;

FIG. 23 is a schematic drawing in a step subsequent to FIG. 21; and

FIG. 24 is a schematic drawing in a step subsequent to FIG. 23.

DETAILED DESCRIPTION

Figure 1:
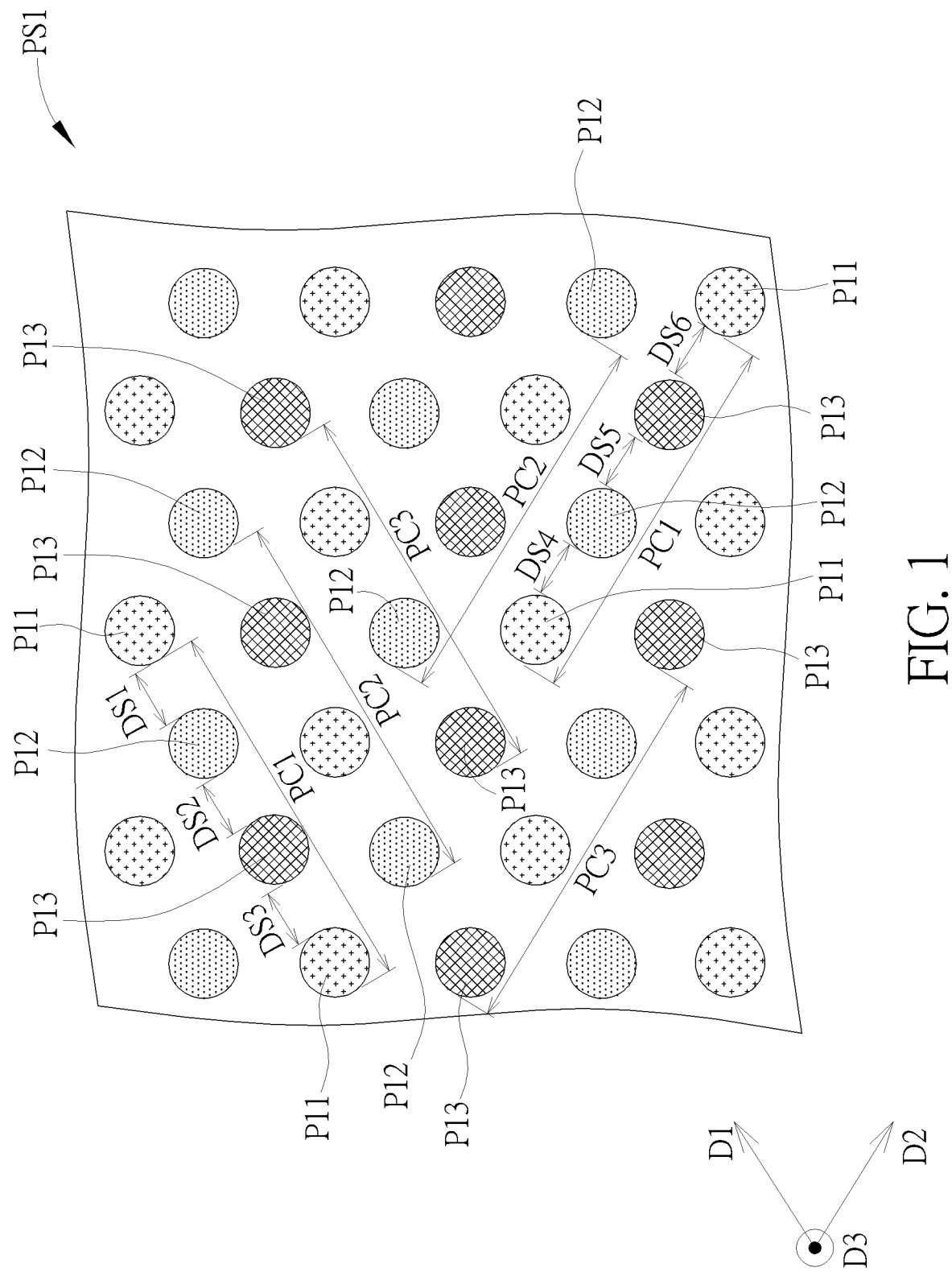
FIG. 1 is a schematic drawing illustrating a patterned structure according to a first embodiment of the present invention.
Figure 2:
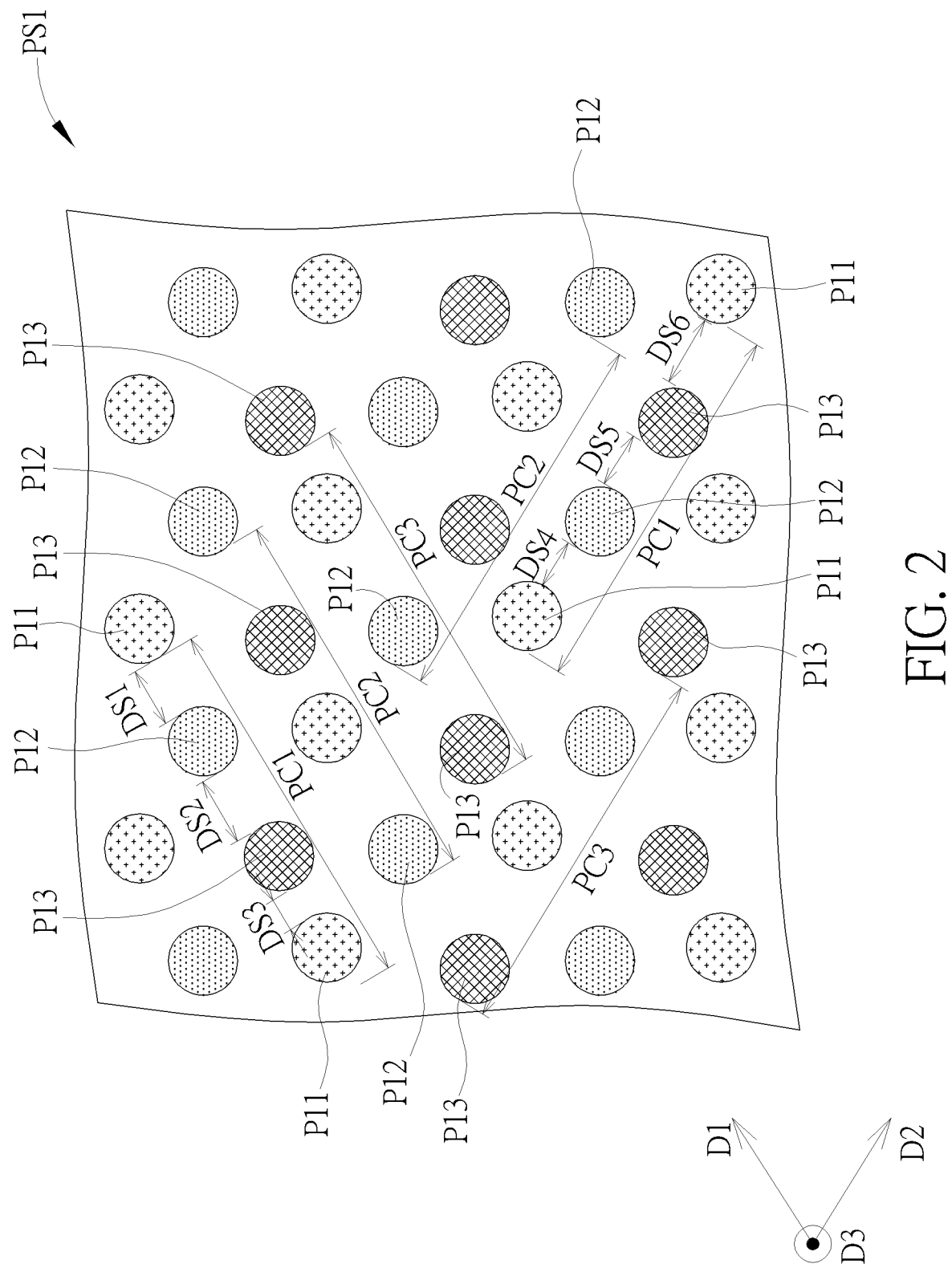
FIG. 2 is a schematic drawing illustrating the patterned structure with misalignments during manufacturing processes according to the first embodiment of the present invention.

Please refer to FIG. 1 and FIG. 2. FIG. 1 is a schematic drawing illustrating a patterned structure according to a first embodiment of the present invention, and FIG. 2 is a schematic drawing illustrating the patterned structure with misalignments during manufacturing processes in this embodiment. As shown in FIG. 1 and FIG. 2, a first patterned structure PS1 is provided in this embodiment. The first patterned structure PS1 includes a plurality of first sub patterns P11, a plurality of second sub patterns P12, and a plurality of third sub patterns P13. The first sub patterns P11 are arranged in a first direction D1 and a second direction D2, and the first sub patterns P11 are arranged in the first direction D1 by a first pitch PC1. The second sub patterns P12 are arranged in the first direction D1 and the second direction D2 also, and the second sub patterns P12 are arranged in the first direction D1 by a second pitch PC2. The third sub patterns P13 are arranged in the first direction D1 and the second direction D2, and the third sub patterns P13 are arranged in the first direction D1 by a third pitch PC3. The first pitch PC1, the second pitch PC2, and the third pitch PC3 are equal to one another. One of the second sub patterns P12 and one of the third sub patterns P13 are disposed between two of the first sub patterns P11 adjacent to each other in the first direction D1. In other words, the first sub patterns P11, the second sub patterns P12, and the third sub patterns P13 may be alternatively disposed in the first direction D1. A first smallest distance DS1 exists between one of the first sub patterns P11 and one of the second sub patterns P12 in the first direction D1, a second smallest distance DS2 exists between one of the second sub patterns P12 and one of the third sub patterns P13 in the first direction D1, and a third smallest distance DS3 exists between one of the first sub patterns P11 and one of the third sub patterns P13 in the first direction D1. As shown in FIG. 1, in some embodiments, when the first smallest distance DS1, the second smallest distance DS2, and the third smallest distance DS3 are smaller than the exposure resolution of the photolithography process, the first sub patterns P11, the second sub patterns P12, and the third sub patterns P13 may be formed by different photolithography processes respectively for overcoming the limitation of the exposure resolution. In other words, the smallest distance between two adjacent first sub patterns P11, the smallest distance between two adjacent second sub patterns P12, and the smallest distance between two adjacent third sub patterns P13 may be larger than the exposure resolution of the photolithography process, but not limited thereto.

As shown in FIG. 1, in some embodiments, when the first sub patterns P11, the second sub patterns P12, and the third sub patterns P13 are formed by three photolithography processes respectively, the first smallest distance DS1, the second smallest distance DS2, and the third smallest distance DS3 may be substantially equal to one another if the alignment condition in each of the photolithography processes is great. However, as shown in FIG. 2, in some embodiments, if misalignments occur in the photolithography processes configured to form the first sub patterns P11, the second sub patterns P12, and the third sub patterns P13, at least two selected from the group consisting of the first smallest distance DS1, the second smallest distance DS2, and the third smallest distance DS3 will be different from one another. For example, the first smallest distance DS1 may be different from the second smallest distance DS2, the second smallest distance DS2 may be different from the third smallest distance DS3, the third smallest distance DS3 may be different from the first smallest distance DS1, or the first smallest distance DS1, the second smallest distance DS2, and the third smallest distance DS3 may be different from one another.

As shown in FIG. 1 and FIG. 2, in some embodiments, the first sub patterns P11 may be arranged in the second direction D2 by the first pitch PC1, the second sub patterns P12 may be arranged in the second direction D2 by the second pitch PC2, and the third sub patterns P13 may be arranged in the second direction D2 by the third pitch PC3. In other words, the first sub patterns P11 may be arranged in the first direction D1 and the second direction D2 respectively by the same pitch, the second sub patterns P12 may be arranged in the first direction D1 and the second direction D2 respectively by the same pitch, and the third sub patterns P13 may be arranged in the first direction D1 and the second direction D2 respectively by the same pitch. The pitch of the first sub patterns P11 in the first direction D1 and the second direction D2, the pitch of the second sub patterns P12 in the first direction D1 and the second direction D2, and the pitch of the third sub patterns P13 in the first direction D1 and the second direction D2 may be substantially equal to one another, but not limited thereto. In some embodiments, the pitch of the first sub patterns P11 in the second direction D2 may be different from the pitch of the first sub patterns P11 in the first direction D1, the pitch of the second sub patterns P12 in the second direction D2 may be different from the pitch of the second sub patterns P12 in the first direction D1, and the pitch of the third sub patterns P13 in the second direction D2 may be different from the pitch of the third sub patterns P13 in the first direction D1 also.

As shown in FIG. 1 and FIG. 2, in some embodiments, one of the second sub patterns P12 and one of the third sub patterns P13 may be disposed between two of the first sub patterns P11 adjacent to each other in the second direction D2. In other words, the first sub patterns P11, the second sub patterns P12, and the third sub patterns P13 may be alternatively disposed in the second direction D2 also. A fourth smallest distance DS4 exists between one of the first sub patterns P11 and one of the second sub patterns P12 in the second direction D2, a fifth smallest distance DS5 exists between one of the second sub patterns P12 and one of the third sub patterns P13 in the second direction D2, and a sixth smallest distance DS6 exists between one of the first sub patterns P11 and one of the third sub patterns P12 in the second direction D2. As shown in FIG. 1, when the first sub patterns P11, the second sub patterns P12, and the third sub patterns P13 are formed by three photolithography processes respectively and the pitches of the first sub patterns P11, the second sub patterns P12, and the third sub patterns P13 in the first direction D1 and the second direction D2 are equal to one another, the first smallest distance DS1, the second smallest distance DS2, the third smallest distance DS3, the fourth smallest distance DS4, the fifth smallest distance DS5, and the sixth smallest distance DS6 may be substantially equal to one another if the alignment condition in each of the photolithography processes is great. However, as shown in FIG. 2, in some embodiments, if misalignments occur in the photolithography processes configured to form the first sub patterns P11, the second sub patterns P12, and the third sub patterns P13, at least two selected from the group consisting of the fourth smallest distance DS4, the fifth smallest distance DS5, and the sixth smallest distance DS6 will be different from one another. For example, the fourth smallest distance DS4 may be different from the fifth smallest distance DS5, the fifth smallest distance DS5 may be different from the sixth smallest distance DS6, the sixth smallest distance DS6 may be different from the fourth smallest distance DS4, or the fourth smallest distance DS4, the fifth smallest distance DS5, and the sixth smallest distance DS6 may be different from one another.

As shown in FIG. 1 and FIG. 2, in some embodiments, the first direction D1 is different from the second direction D2, and an included angle between the first direction D1 and the second direction D2 is smaller than 90 degrees. Additionally, in some embodiments, a shape of each of the first sub patterns P11, a shape of each of the second sub patterns P12, and a shape of each of the third sub patterns P13 may be identical to one another, and the first sub patterns P11, the second sub patterns P12, and the third sub patterns P13 may be disposed on the same plane, but not limited thereto. In some embodiments, at least two selected from the group consisting of the shape of the first sub pattern P11, the shape of the second sub pattern P12, and the shape of the third sub pattern P13 may be different from one another, and at least two selected from the group consisting of the first sub pattern P11, the second sub pattern P12, and the third sub pattern P13 may be disposed on different planes.

Figure 25:
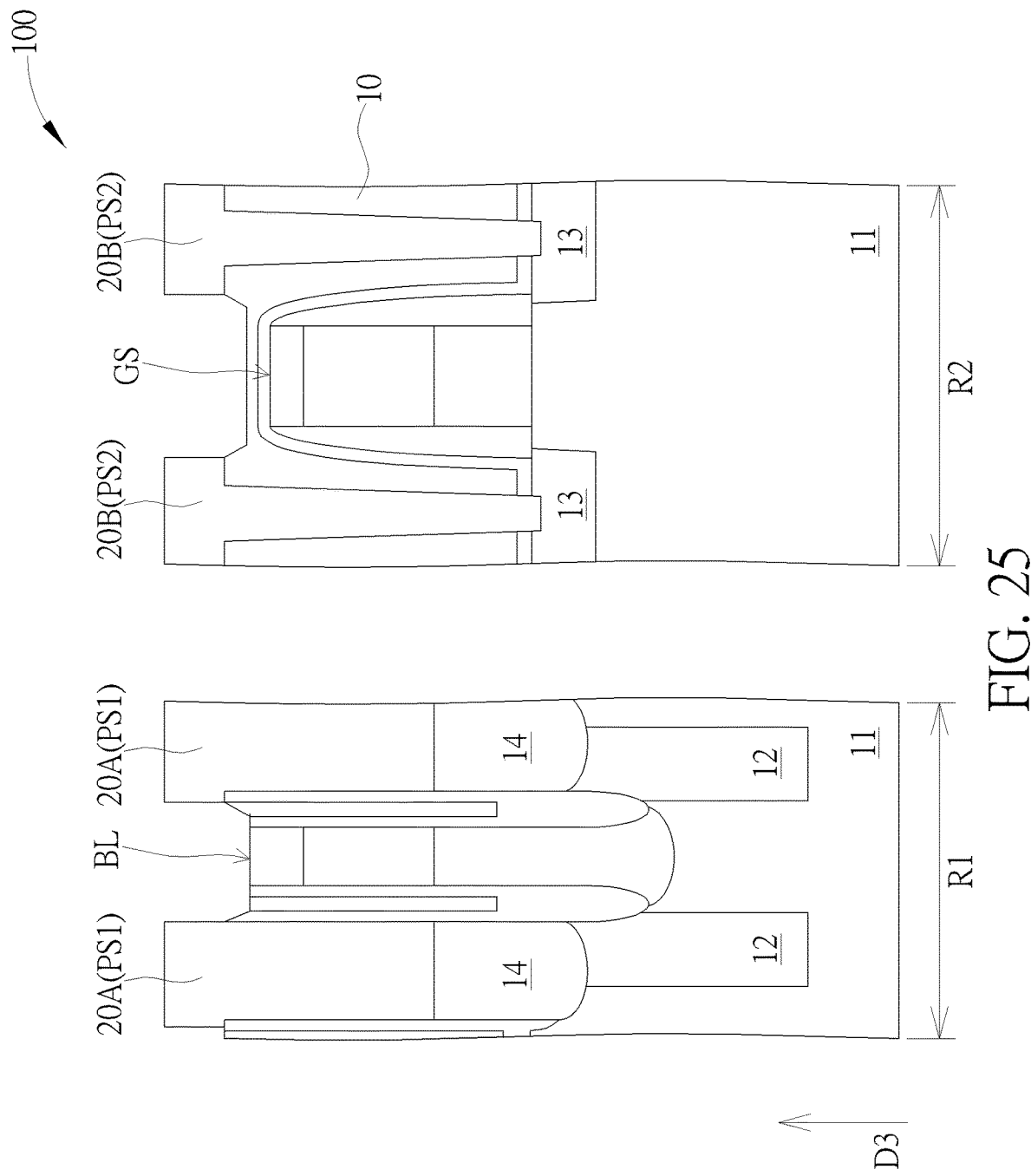
FIG. 25 is a schematic drawing illustrating a semiconductor memory device formed by the patterning method according to the first embodiment of the present invention.

Please refer to FIG. 2 and FIG. 25. FIG. 25 is a schematic drawing illustrating a semiconductor memory device including the patterned structure of the first embodiment in the present invention. As shown in FIG. 2 and FIG. 25, a semiconductor memory device 100 may include a semiconductor substrate 11, a shallow trench isolation 12, a source/drain region 13, a gate structure GS, a bit line structure BL, a dielectric layer 10, a storage node contact 14, a storage node pad 20A, and a connection structure 20B. The shallow trench isolation 12 is disposed in the semiconductor substrate 11 for defining a plurality of active regions. The bit line structure BL, the storage node contact 14, and the storage node pad 20A may be disposed in a first region R1, and the source/drain region 13, the gate structure GS, and the connection structure 20B may be disposed in a second region R2. In some embodiments, the first region R1 may include a memory cell region, the second region R2 may include a peripheral region for forming peripheral circuit units such as transistors configured to control signals transmitted by word lines and/or bit lines, and the first patterned structure PS1 may be the storage node pads 20A in the semiconductor memory device 100, but not limited thereto. In other words, the first sub patterns P11, the second sub patterns P12, and the third sub patterns P13 may include the storage node pads 20A of the semiconductor memory device 100.

In some embodiments, the semiconductor substrate 11 may include silicon substrate, epitaxial silicon substrate, silicon germanium substrate, silicon carbide substrate or silicon-on-insulator (SOI) substrate, but not limited thereto. The bit line structure BL and the gate structure GS may be formed by a single layer or multiple layers of conductive materials and an insulation cap layer respectively. The dielectric layer 10 may include silicon oxide, silicon oxynitride, or other suitable dielectric materials. The storage node contact 14 contacts the corresponding active region and is electrically isolated from the bit line structure BL, and the storage node contact 14 may include aluminum, tungsten, copper, titanium aluminide, or other suitable low resistivity conductive materials. The connection structure 20B may penetrate the dielectric layer 10 overlapping the source/drain region 13 for being electrically connected with the corresponding source/drain region 13. The storage node pad 20A may include a conductive material, and the storage node pad 20A is electrically connected with the storage node contact 14.

Figure 3:
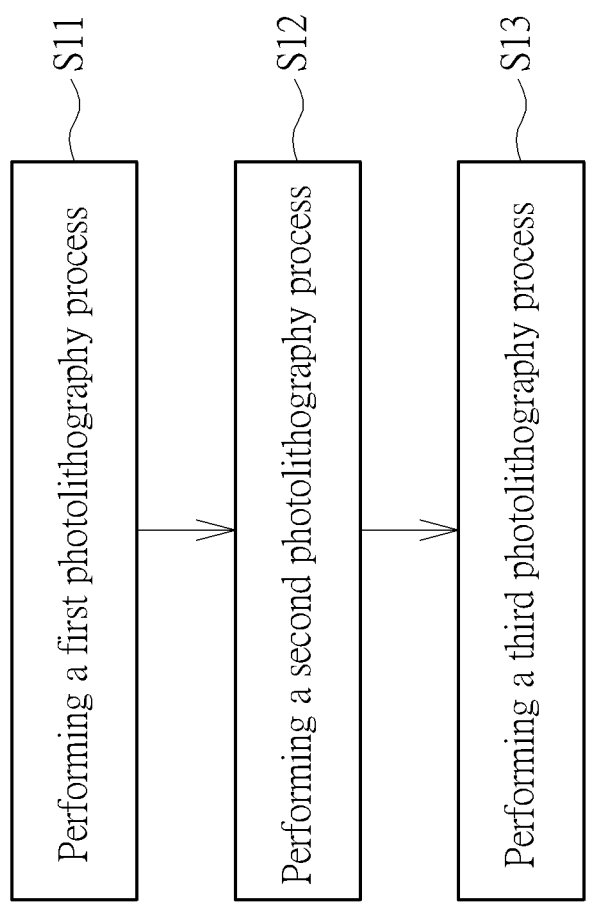
Figure 4:
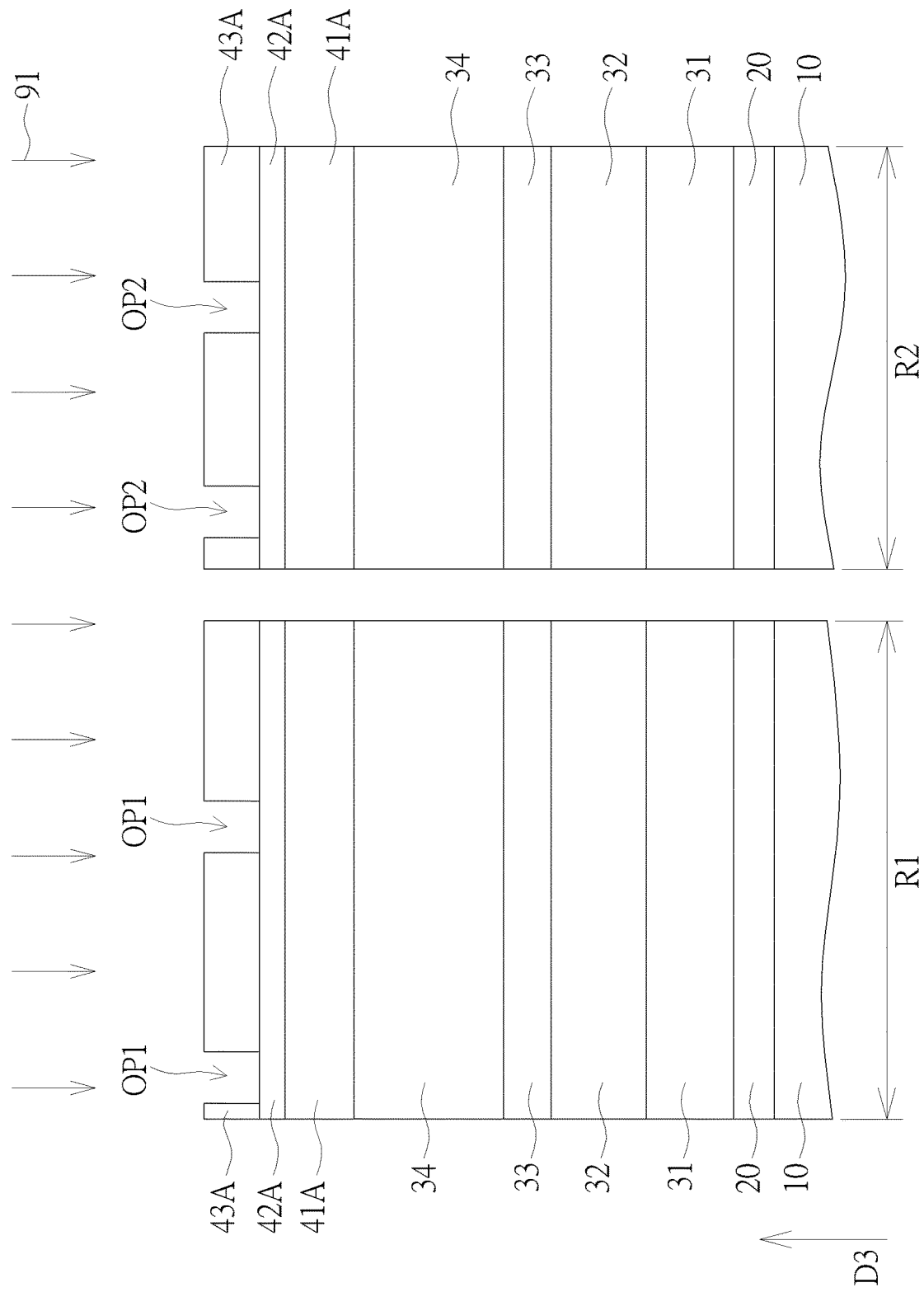

Please refer to FIGS. 3-24. FIGS. 3-24 are schematic drawings illustrating a patterning method according to the first embodiment of the present invention. FIG. 3 is a flow chart. FIG. 4, FIG. 7, FIG. 8, FIG. 9, FIG. 12, FIG. 13, FIG. 14, FIG. 17, FIG. 18, FIG. 21, FIG. 23, and FIG. 24 are cross-sectional diagrams, and FIG. 5, FIG. 6, FIG. 10, FIG. 11, FIG. 15, FIG. 16, FIG. 19, FIG. 20, and FIG. 22 are top view diagrams. The left half of FIG. 4 may be regarded as a cross-sectional diagram taken along a line A1-A1' in FIG. 5, and the right half of FIG. 4 may be regarded as a cross-sectional diagram taken along a line B1-B1' in FIG. 6. The left half of FIG. 9 may be regarded as a cross-sectional diagram taken along a line A2-A2' in FIG. 10, and the right half of FIG. 9 may be regarded as a cross-sectional diagram taken along a line B2-B2' in FIG. 11. The left half of FIG. 14 may be regarded as a cross-sectional diagram taken along a line A3-A3' in FIG. 15, and the right half of FIG. 14 may be regarded as a cross-sectional diagram taken along a line B3-B3' in FIG. 16. The left half of FIG. 18 may be regarded as a cross-sectional diagram taken along a line A4-A4' in FIG. 19, and the right half of FIG. 18 may be regarded as a cross-sectional diagram taken along a line B4-B4' in FIG. 20. The left half of FIG. 21 may be regarded as a cross-sectional diagram taken along a line A5-A5' in FIG. 22. The patterning method in this embodiment may include the following steps. As shown in FIGS. 2-7, a material layer 20 is formed on a mask layer 34. In some embodiments, the material layer 20 may be formed on the dielectric layer 10 described above, and the material layer 20 may include conductive materials such as aluminum, tungsten, copper, or titanium aluminide, but not limited thereto. In some embodiments, the material layer 20 may include other materials such as insulation materials according to other considerations. Additionally, other material layers may be formed between the mask layer 34 and the material layer 20 according to other considerations. In some embodiments, a first mask layer 31, a second mask layer 32, and a third mask layer 33 may be disposed between the mask layer 34 and the material layer 20 in a thickness direction of the material layer 20 (such as a third direction D3 shown in FIG. 4), and materials of the first mask layer 31, the second mask layer 32, the third mask layer 33, and the mask layer 34 may be different from one another, but not limited thereto. For example, the first mask layer 31, the second mask layer 32, the third mask layer 33, and the mask layer 34 may include a silicon nitride layer, an advanced patterning film (APF), a silicon oxynitride layer, and an oxide layer respectively, but not limited thereto. Subsequently, a first photolithography process 91 is performed, and a first hole H11 is formed in the mask layer 34 by the first photolithography process 91. In some embodiments, a first organic dielectric layer 41A, a first anti-reflection layer 42A, and a first patterned photoresist layer 43A may be sequentially formed on the mask layer 34. The first organic dielectric layer 41A may include an organic distribution layer (ODL), and the first anti-reflection layer 42A may include a silicon-containing hard mask bottom anti-reflecting coating (SHB), but not limited thereto. The first photolithography process 91 may include a photoresist coating process, an exposure process, and a develop process for forming the first patterned photoresist layer 43A, and an etching process using the first patterned photoresist layer 43A as a mask. The first hole H11 may be formed in the mask layer 34 by a first opening OP1 in the first patterned photoresist layer 43A and the etching process using the first patterned photoresist layer 43A in the first photolithography process 91.

Figure 5:
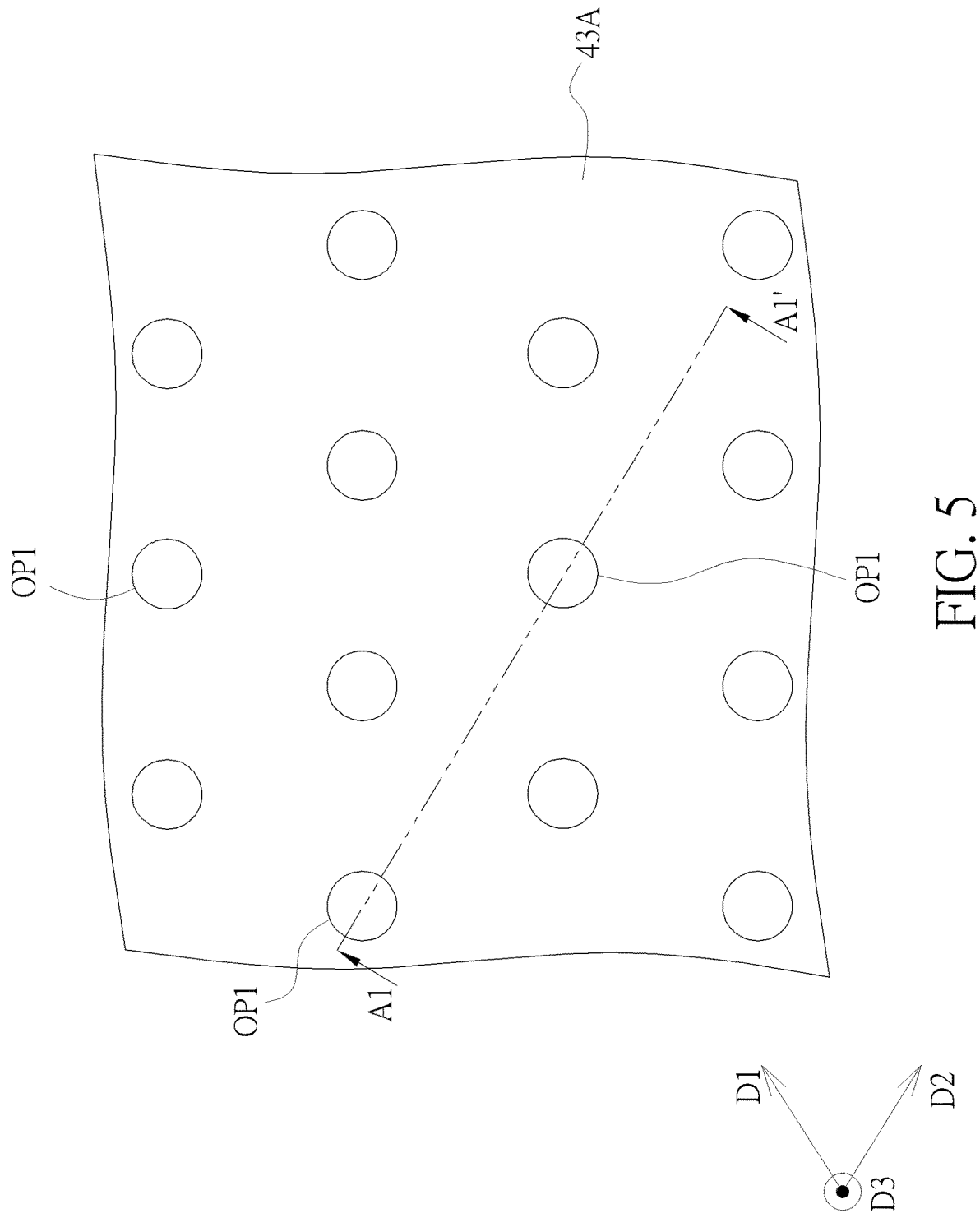
Figure 6:
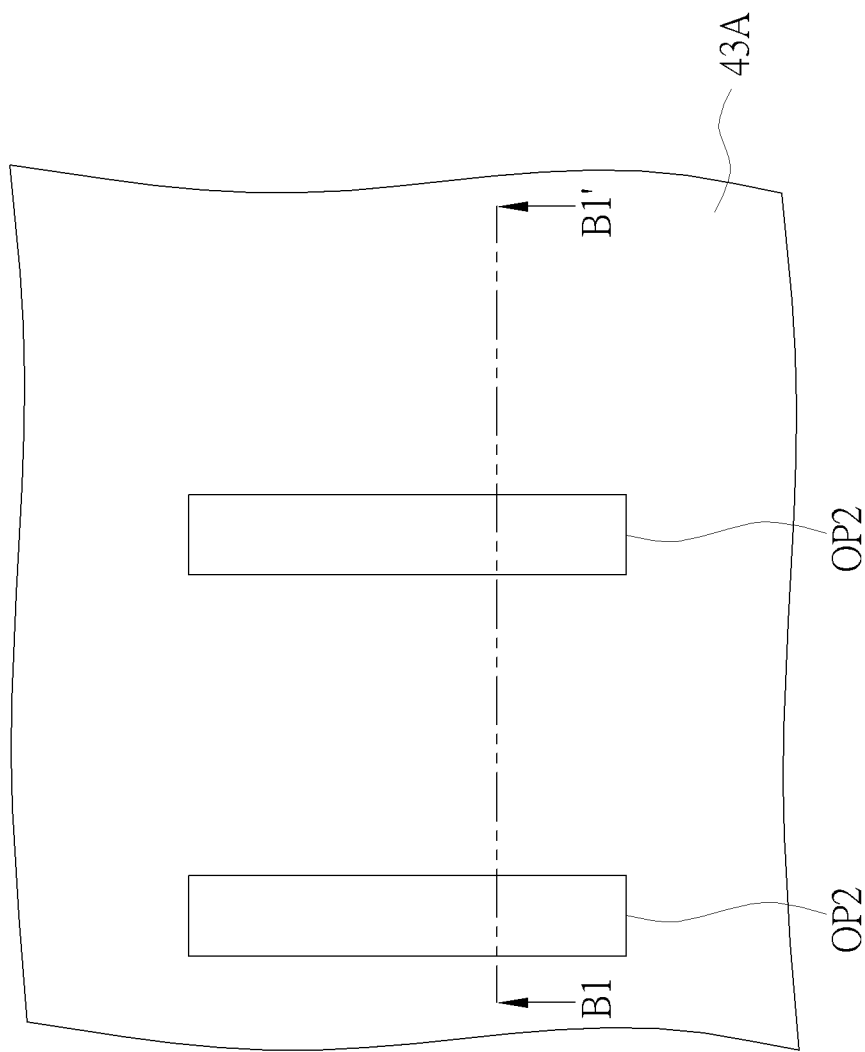
Figure 7:
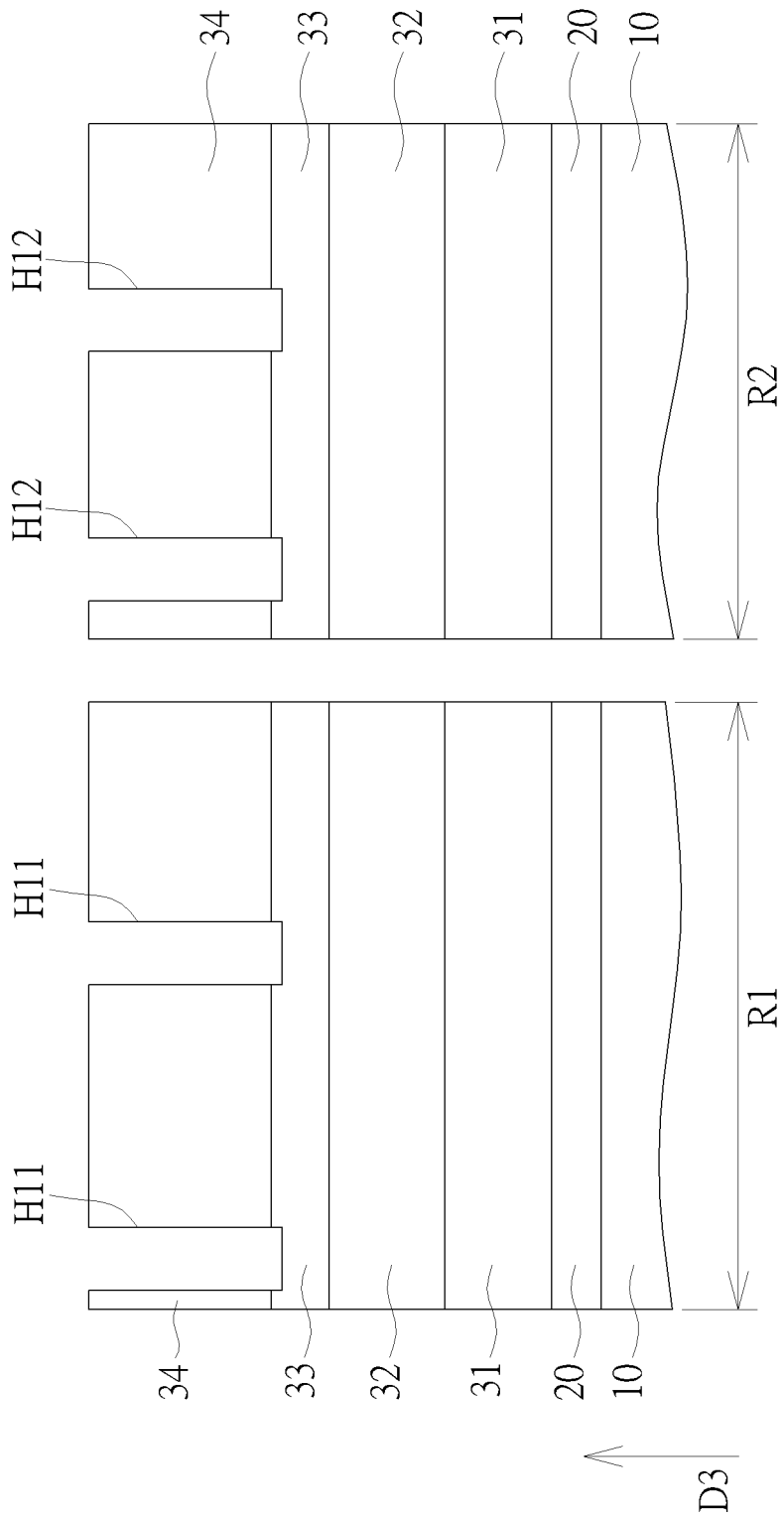

As shown in FIGS. 4-7, in some embodiments, the first region R1 and the second region R2 may be defined on the material layer 20, and the first hole H11 is formed on the first region R1. Therefore, FIG. 5 may be a top view diagram of the first region R1, FIG. 6 may be a top view diagram of the second region R2, and FIG. 4 may be regarded as a cross-sectional diagram of a part of the first region R1 and a part of the second region R2. In some embodiments, the patterning method may further include forming a third hole H12 in the mask layer 34 by the first photolithography process 91. The third hole H12 may be formed on the second region R2, and the shape of the third hole H12 may be different from the shape of the first hole H11. In some embodiments, the first patterned photoresist layer 43A may have a second opening OP2 on the second region R2, and the third hole H12 may be formed in the mask layer 34 by the second opening OP2 in the first patterned photoresist layer 43A and the etching process using the first patterned photoresist layer 43A in the first photolithography process 91. As shown in FIG. 5 and FIG. 6, the shape of the second opening OP2 in the first patterned photoresist layer 43A may be different from the shape of the first opening OP1 in the first patterned photoresist layer 43A. For instance, the first opening OP1 may be a circle or a rectangle, and the second opening OP2 may be a slot, but not limited thereto. Additionally, in some embodiments, the first opening OP1 and the second opening OP2 in the first patterned photoresist layer 43A may be formed concurrently by an exposure process using the same photomask and/or the same set of photomask for process simplification and production cost reduction, but not limited thereto. Additionally, as shown in FIGS. 4-7, the first hole H11 on the first region R1 and the third hole H12 on the second region R2 may be formed concurrently by the first photolithography process 91, and the first hole H11 and the third hole H12 may penetrate the mask layer 34 without penetrating the third mask layer 33, but not limited thereto. The first patterned photoresist layer 43A, the first anti-reflection layer 42A, and the first organic dielectric layer 41A may be removed after the step of forming the first hole H11 and the third hole H12.

Figure 8:
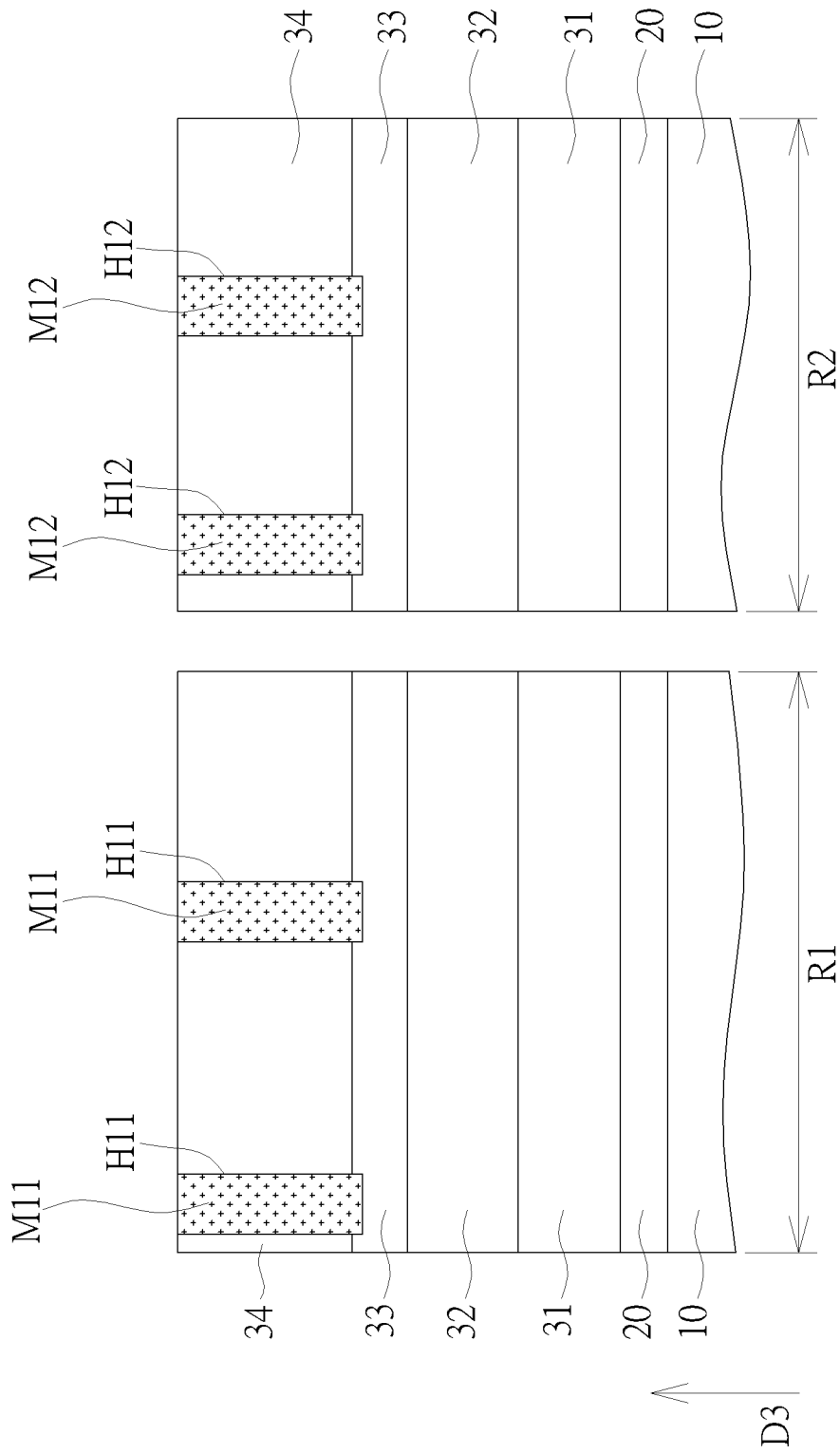
Figure 9:
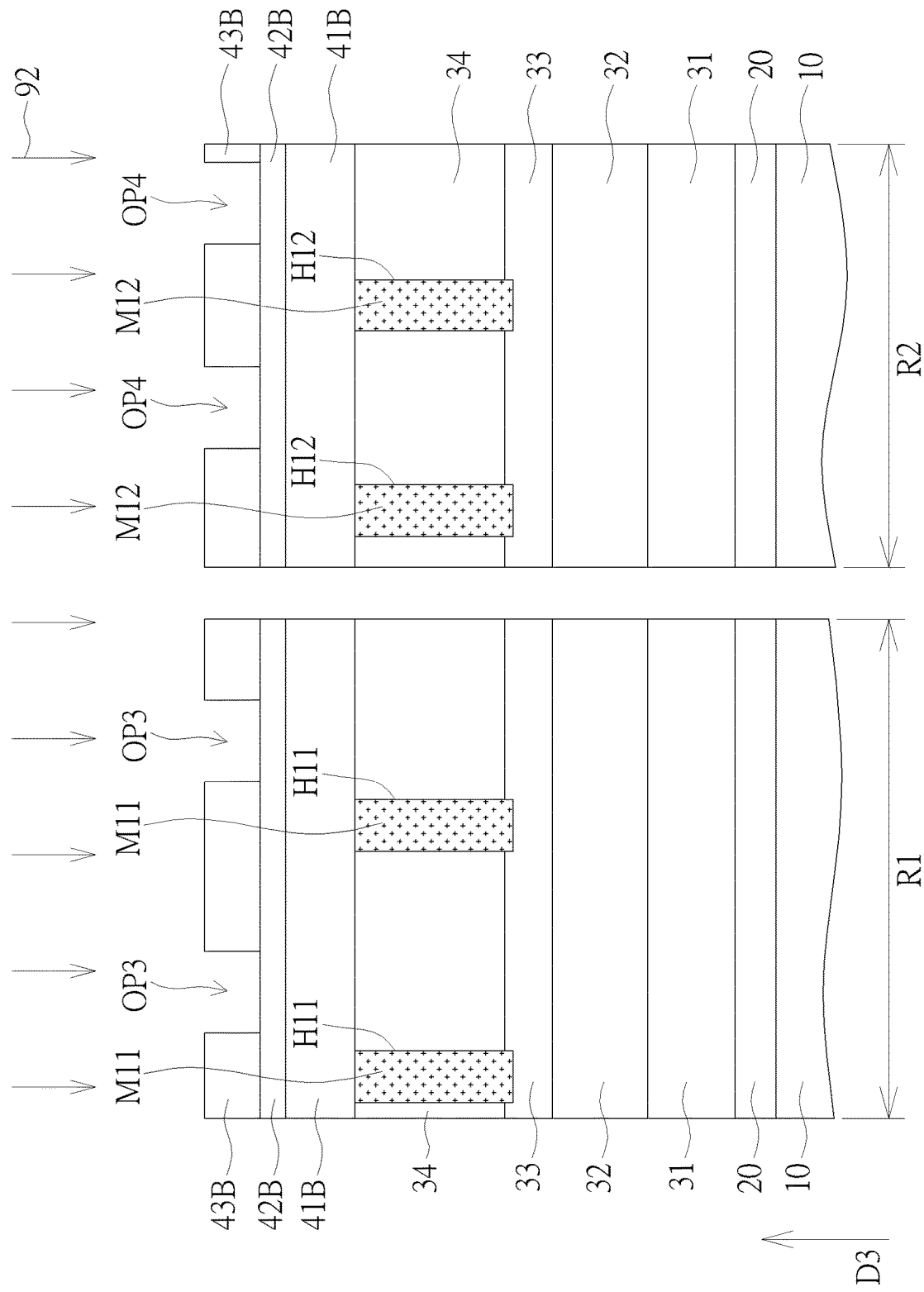

As shown in FIG. 8, a first mask pattern M11 is then formed in the first hole H11. In some embodiments, the first mask pattern M11 may be formed by forming a mask material on the mask layer 34, filling the first hole H11 with the mask material, and removing the mask material outside the first hole H11 by a planarization process, but not limited thereto. The mask material described above may include insulation materials such as silicon nitride or other insulation materials or conductive materials with better gap-filling ability. Additionally, in some embodiments, the patterning method may further include forming a third mask pattern M12 in the third hole H12. The material and the manufacturing method of the third mask pattern M12 may be the same as those of the first mask pattern M11, and the third mask pattern M12 and the first mask pattern M11 may be formed concurrently by the same manufacturing method, but not limited thereto. In some embodiments, the first mask pattern M11 and the third mask pattern M12 may be formed by different materials and/or different manufacturing methods respectively according to some considerations.

Figure 10:
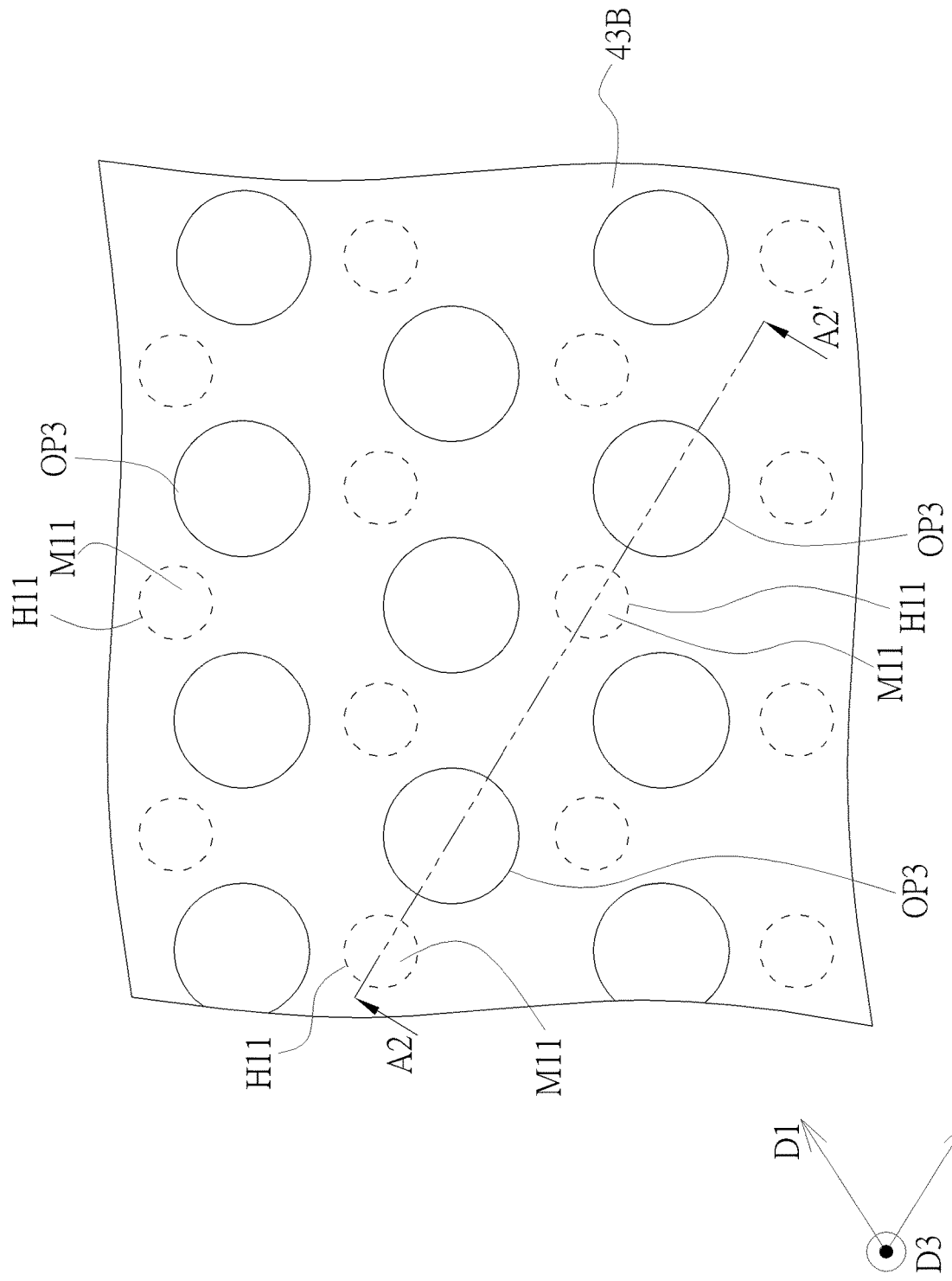
Figure 11:
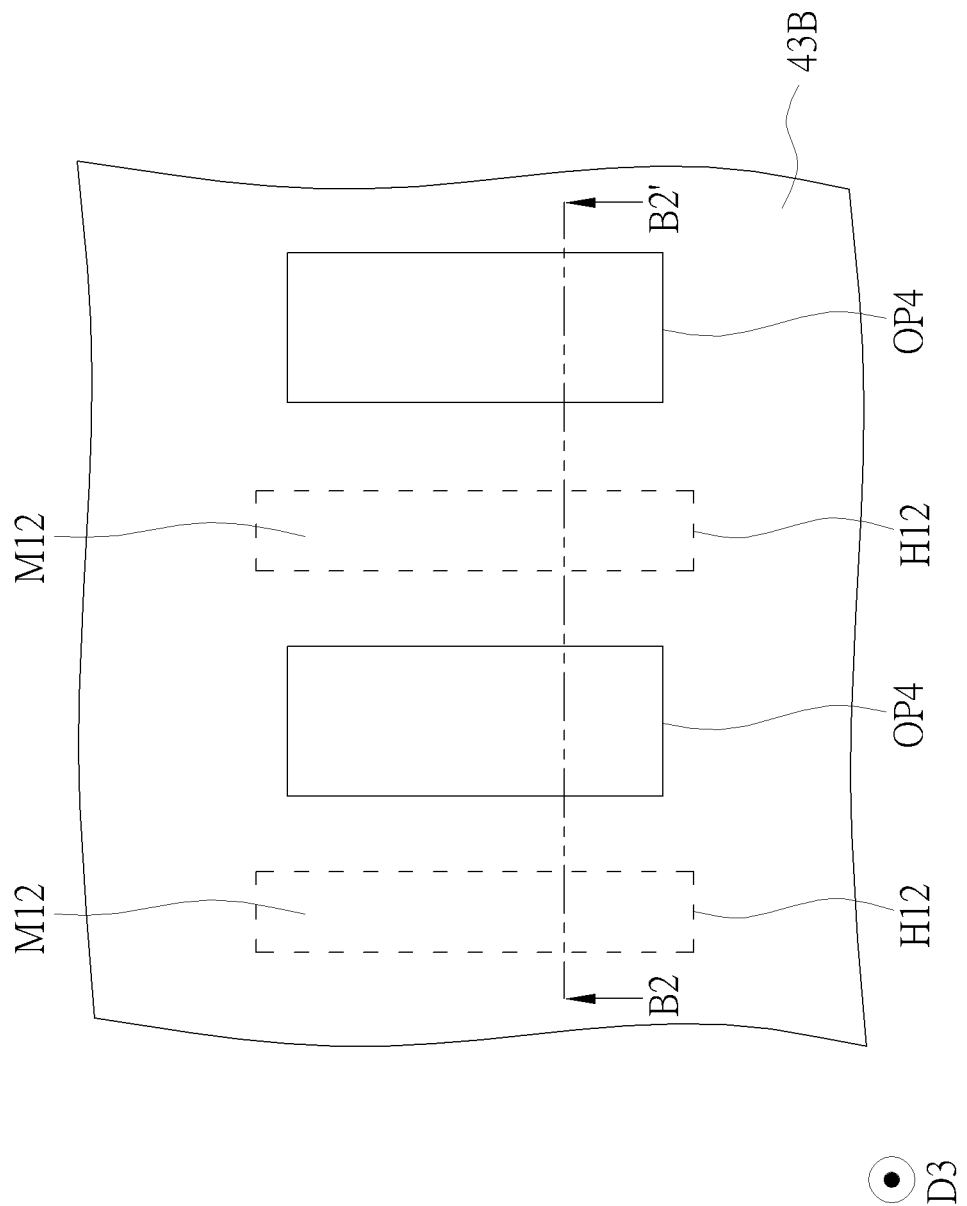
Figure 12:
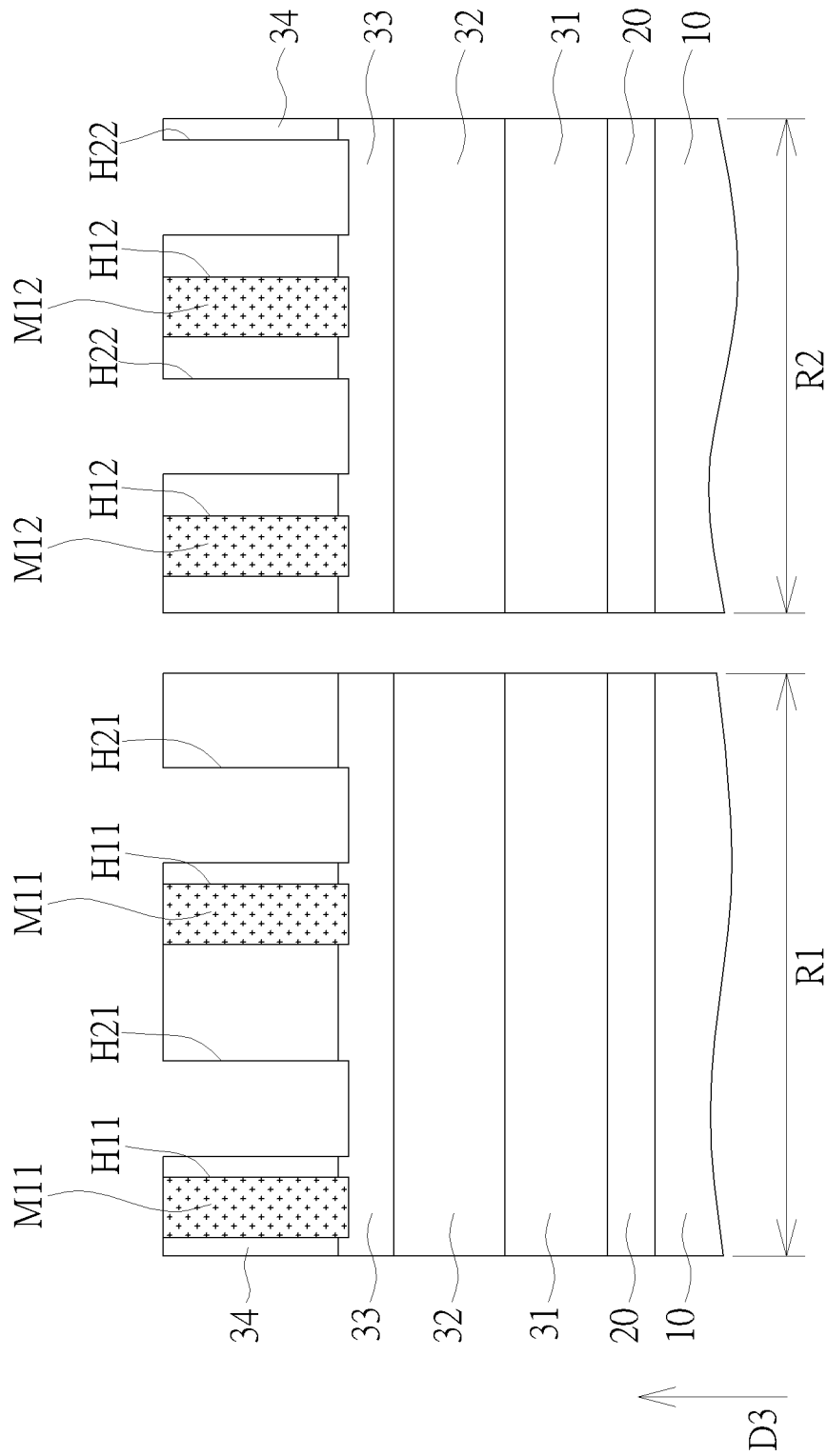
Figure 13:
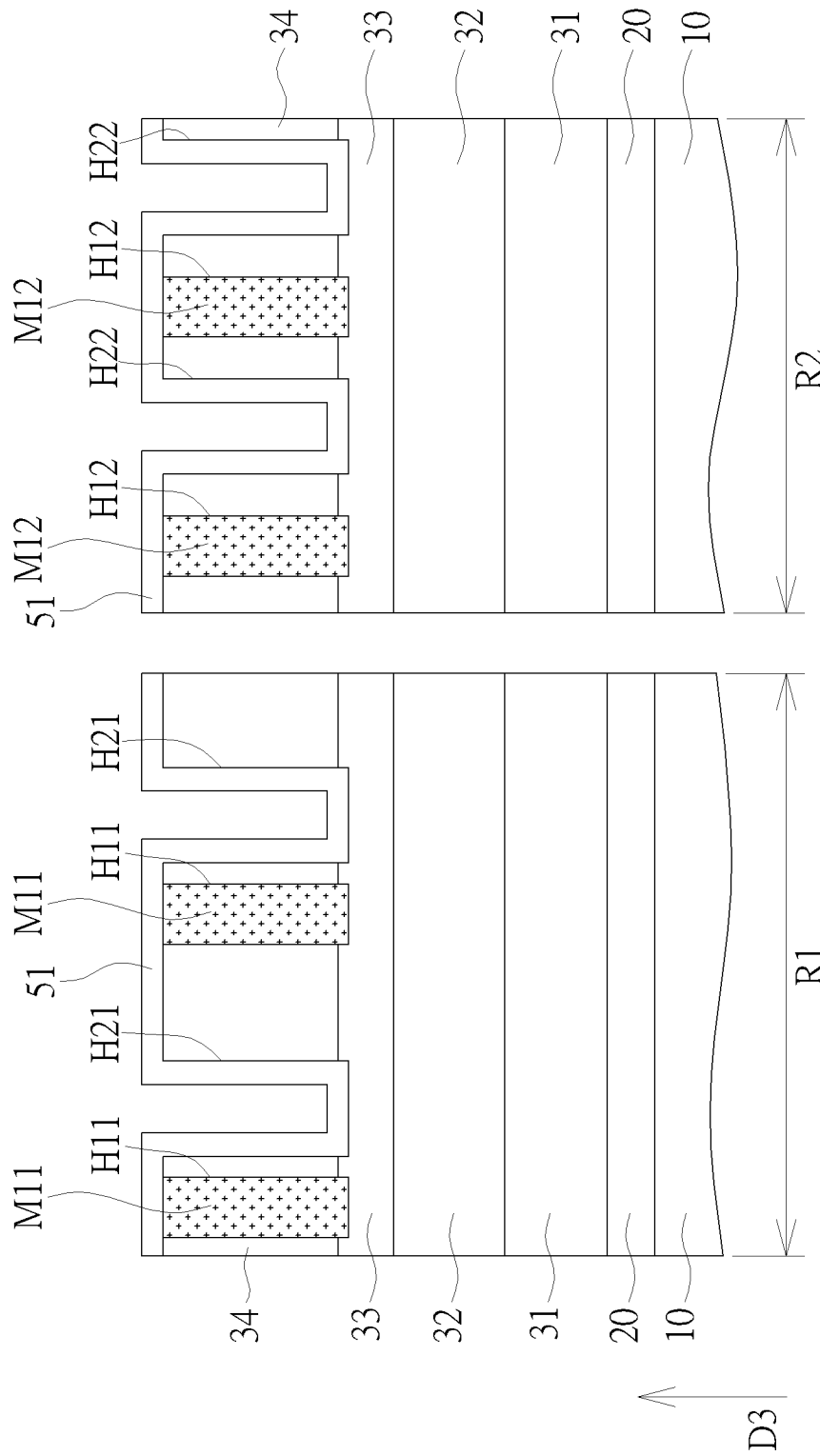
Figure 14:
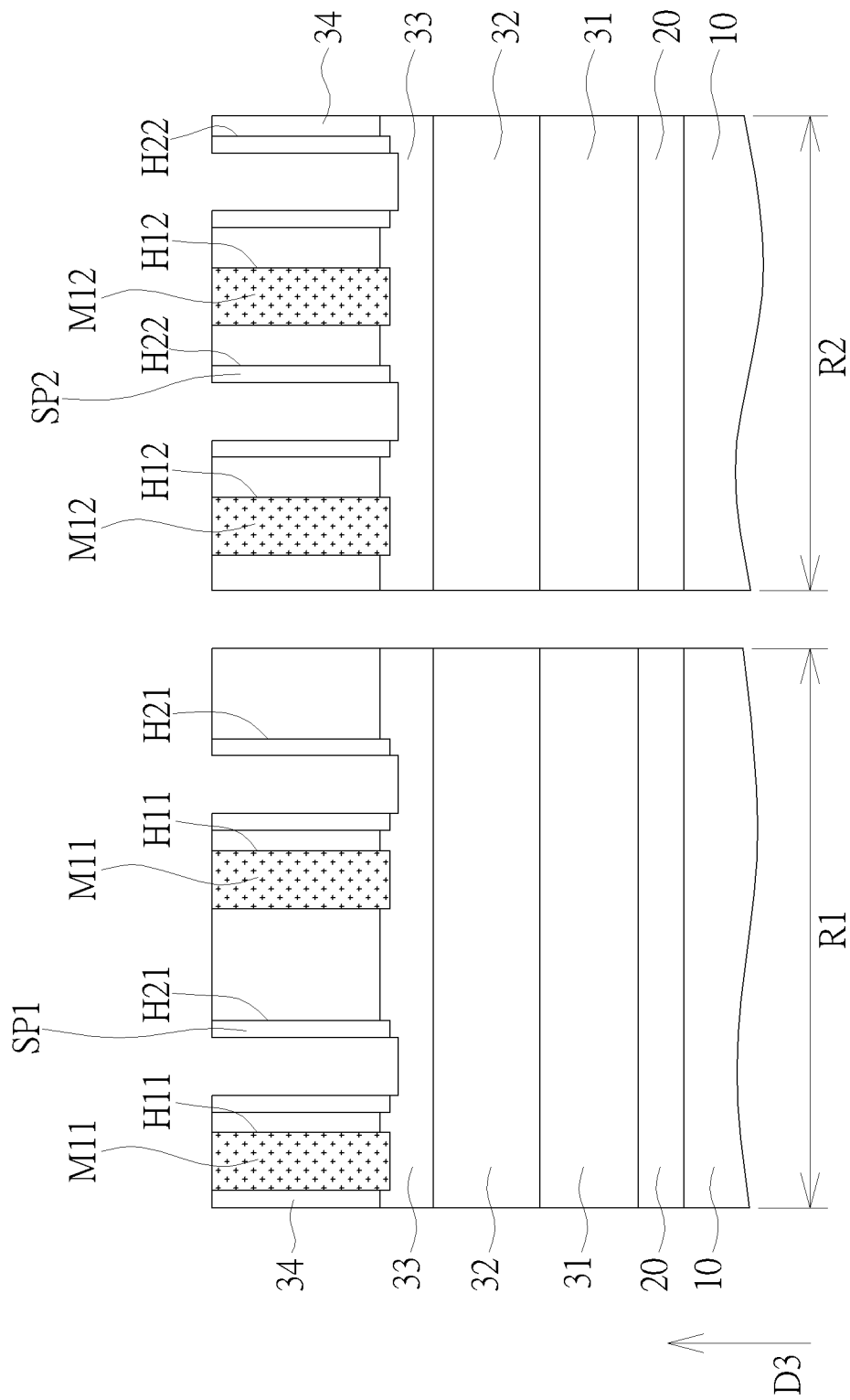

As shown in FIGS. 9-12, a second photolithography process 92 is then performed, and a second hole H21 is formed in the mask layer 34 by the second photolithography process 92. In some embodiments, a second organic dielectric layer 41B, a second anti-reflection layer 42B, and a second patterned photoresist layer 43B may be sequentially formed on the mask layer 34. The second organic dielectric layer 41B may include an organic distribution layer, and the second anti-reflection layer 42B may include a silicon-containing hard mask bottom anti-reflecting coating, but not limited thereto. The second photolithography process 92 may include a photoresist coating process, an exposure process, and a develop process for forming the second patterned photoresist layer 43B, and an etching process using the second patterned photoresist layer 43B as a mask. The second hole H21 may be formed in the mask layer 34 by a third opening OP3 disposed on the first region R1 and disposed in the second patterned photoresist layer 43B and the etching process using the second patterned photoresist layer 43B in the second photolithography process 92. In some embodiments, the patterning method may further include forming a fourth hole H22 in the mask layer 34 by the second photolithography process 92. The fourth hole H22 may be formed on the second region R2, and the shape of the fourth hole H22 may be different from the shape of the second hole H21. In some embodiments, the second patterned photoresist layer 43B may have a fourth opening OP4 on the second region R2, and the fourth hole H22 may be formed in the mask layer 34 by the fourth opening OP4 in the second patterned photoresist layer 43B and the etching process using the second patterned photoresist layer 43B in the second photolithography process 92. As shown in FIG. 10 and FIG. 11, the shape of the fourth opening OP4 in the second patterned photoresist layer 43B may be different from the shape of the third opening OP3 in the second patterned photoresist layer 43B, the shape of the third opening OP3 may be similar to the shape of the first hole H11, and the shape of the fourth opening OP4 may be similar to the shape of the third hole H12, but not limited thereto. Additionally, in some embodiments, the third opening OP3 and the fourth opening OP4 in the second patterned photoresist layer 43B may be formed concurrently by an exposure process using the same photomask and/or the same set of photomask for process simplification and production cost reduction, but not limited thereto. Additionally, as shown in FIGS. 9-12, the second hole H21 on the first region R1 and the fourth hole H22 on the second region R2 may be formed concurrently by the second photolithography process 92, and the second hole H21 and the fourth hole H12 may penetrate the mask layer 34 without penetrating the third mask layer 33, but not limited thereto. The second patterned photoresist layer 43B, the second anti-reflection layer 42B, and the second organic dielectric layer 41B may be removed after the step of forming the second hole H21 and the fourth hole H22.

Figure 15:
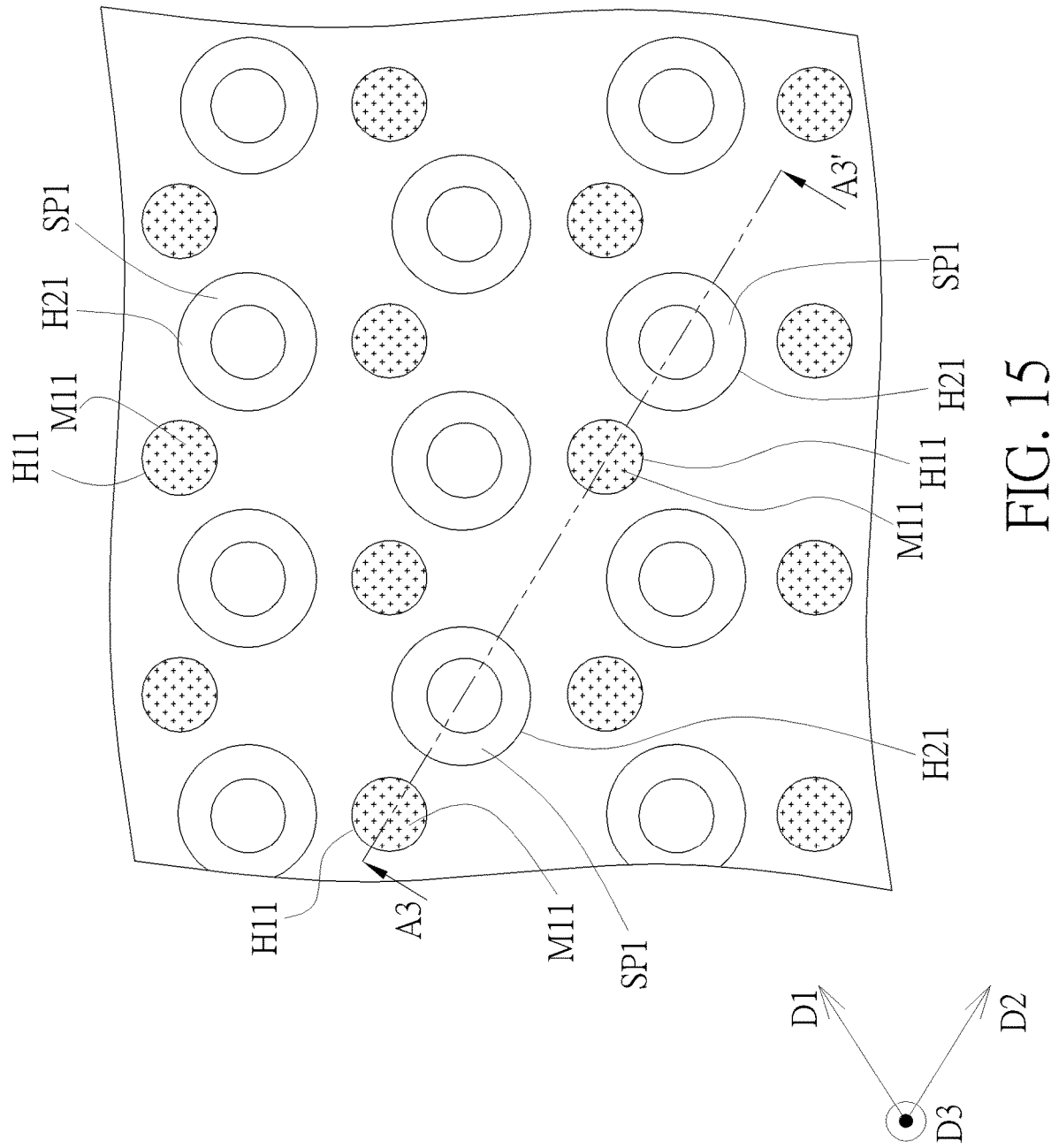
Figure 16:
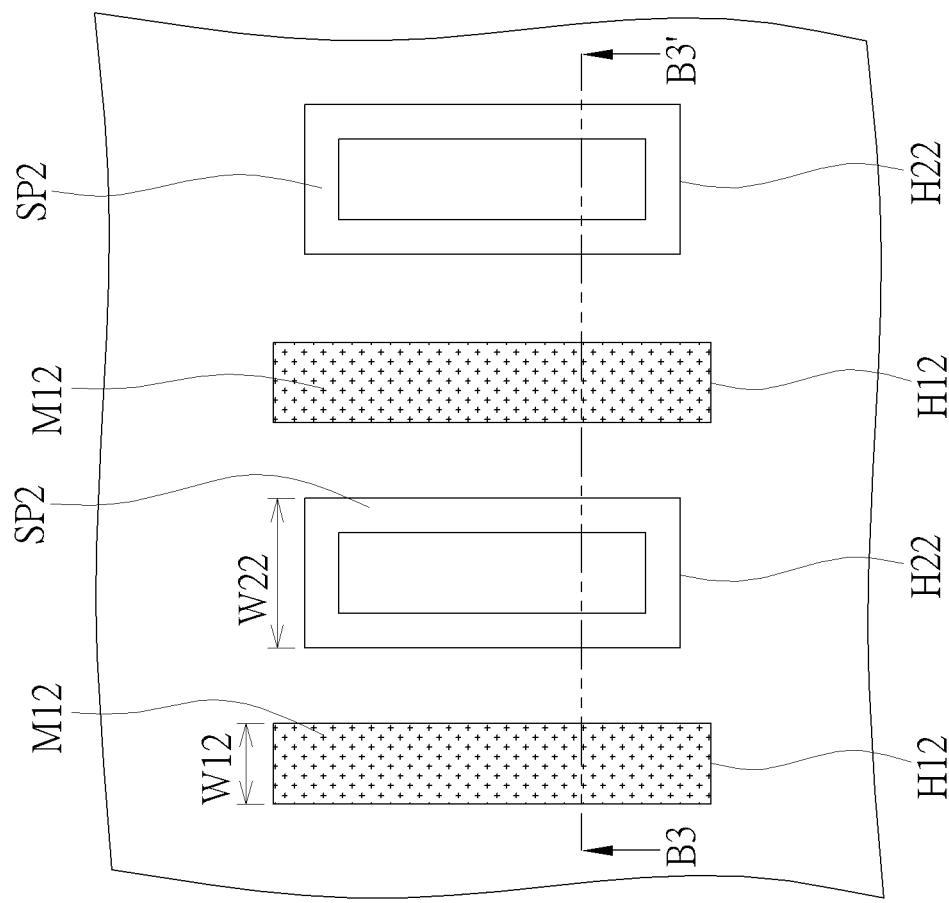

As shown in FIGS. 13-16, a first spacer SP1 is formed on an inner wall of the second hole H21. The method of forming the first spacer SP1 may include but is not limited to the following steps. Firstly, a spacer layer 51 is conformally formed on the top surface of the mask layer 34 and the top surface of the first mask pattern M11 and conformally formed in the second hole H21, and the second hole H21 is not completely filled with the spacer layer 51. The spacer layer 51 may include insulation materials such as oxide insulation materials or other suitable insulation materials or conductive materials capable of being conformally formed in the second hole H21. An etching back process is then performed to the spacer layer 51 for forming the first spacer SP1 on the inner wall of the second hole H21. Additionally, in some embodiments, the patterning method may further include forming a second spacer SP2 on an inner wall of the fourth hole H22. The material and the manufacturing method of the second spacer SP2 may be the same as those of the first spacer SP1, and the second spacer SP2 and the first spacer SP1 may be formed concurrently by the same process, but not limited thereto. In other words, the spacer layer 51 may be further formed conformally in the fourth hole H22, and the fourth hole H22 is not completely filled with the spacer layer 51. Additionally, in some embodiments, the first spacer SP1 and the second spacer SP2 may be formed by different materials and/or different manufacturing methods respectively according to some considerations. As shown in FIG. 15, the second hole H21 may be larger than the first hole H11, and the shape and the dimension of the remaining space in the second hole H21 after forming the first spacer SP1 may be similar to those of the first mask pattern M11 in the third direction D3 by modifying the process conditions of the step of forming the first spacer SP1, but not limited thereto. As shown in FIG. 16, in some embodiments, a width of the fourth hole H22 (such as a second width W22 shown in FIG. 16) may be larger than a width of the third hole H12 (such as a first width W12 shown in FIG. 16), and the width of the remaining space in the fourth hole H22 after forming the second spacer SP2 may substantially equal to the width of the third mask pattern M12 by modifying the process conditions of the step of forming second spacer SP2, but not limited thereto.

Figure 17:
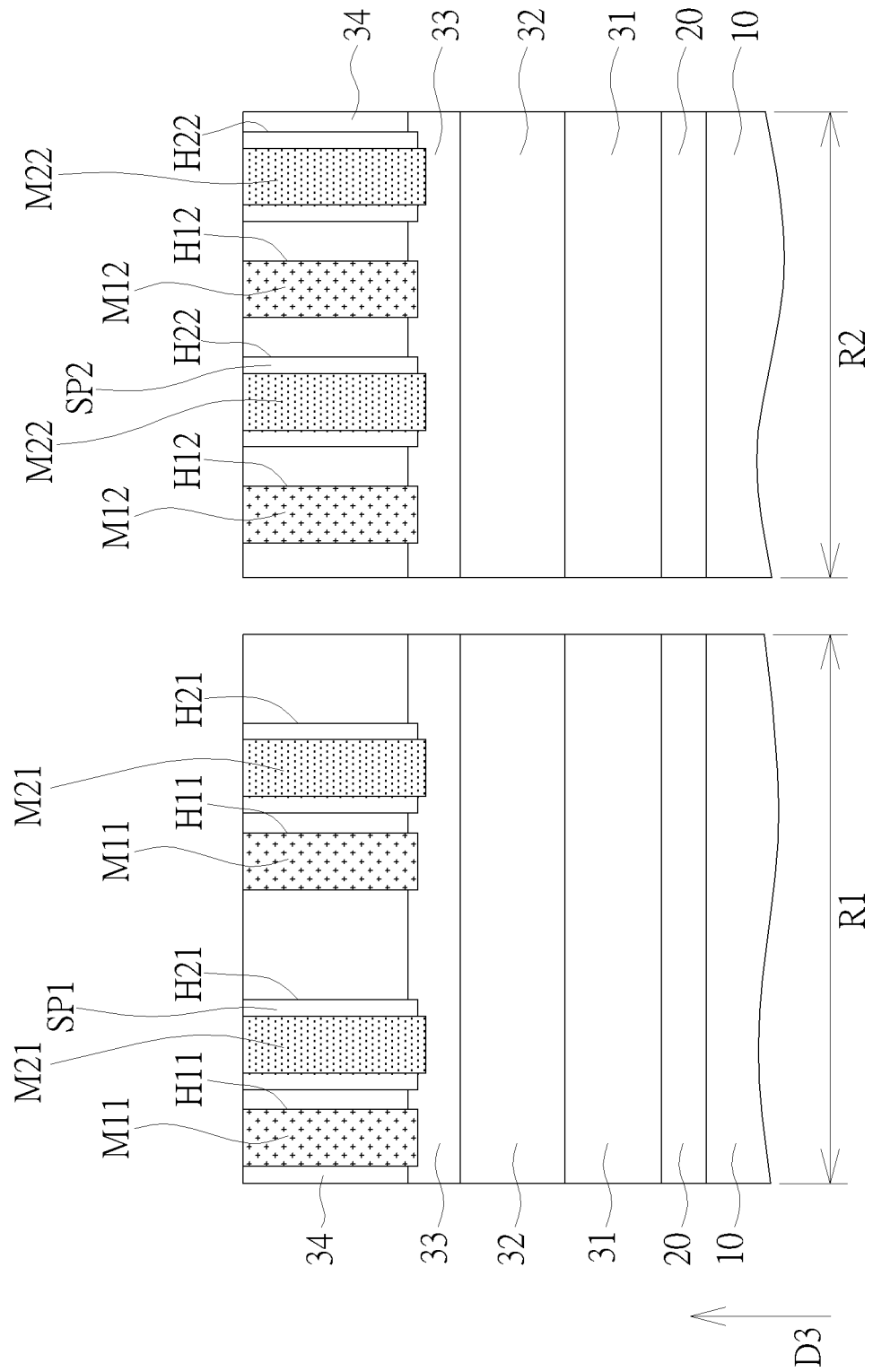

As shown in FIG. 17, a second mask pattern M21 is formed in the second hole H21 after the step of forming the first spacer SP1, and the first spacer SP1 surrounds the second mask pattern M21 in the second hole H21. The material and the manufacturing method of the second mask pattern M21 may be similar to those of the first mask pattern M11 described above, but not limited thereto. In some embodiments, the first mask pattern M11 and the second mask pattern M21 may also be formed by different materials and/or different processes respectively according to some considerations. Additionally, in some embodiments, the patterning method may further include forming a fourth mask pattern M22 in the fourth hole H22 after the step of forming the second spacer SP2, and the second spacer SP2 surrounds the fourth mask pattern M22 in the fourth hole H22. By controlling the process conditions of the step of forming the first spacer SP1 and the second spacer SP2, the shape and the dimension of the second mask pattern M21 may be substantially equal to those of the first mask pattern M11 in the third direction D3, and the width of the fourth mask pattern M22 may be substantially equal to the width of the third mask pattern M12, but not limited thereto. The material and the manufacturing method of the fourth mask pattern M22 may be the same as those of the second mask pattern M21, but not limited thereto. The second mask pattern M21 in the first region R1 will not be directly connected with the first mask pattern M11 and the fourth mask pattern M22 in the second region R2 will not be directly connected with the third mask pattern M12 when misalignments occur in the exposure process of the second photolithography process for forming the second hole H21 and the fourth hole H22 (the second hole H21 may overlap the first hole H11 in the third direction D3, for example) because the first spacer SP1 and the second spacer SP2 are formed in the second hole H21 and the fourth hole H22 respectively before forming the second mask pattern M21 and the fourth mask pattern M22. The manufacturing yield may be improved and the process window may be increased accordingly.

Figure 18:
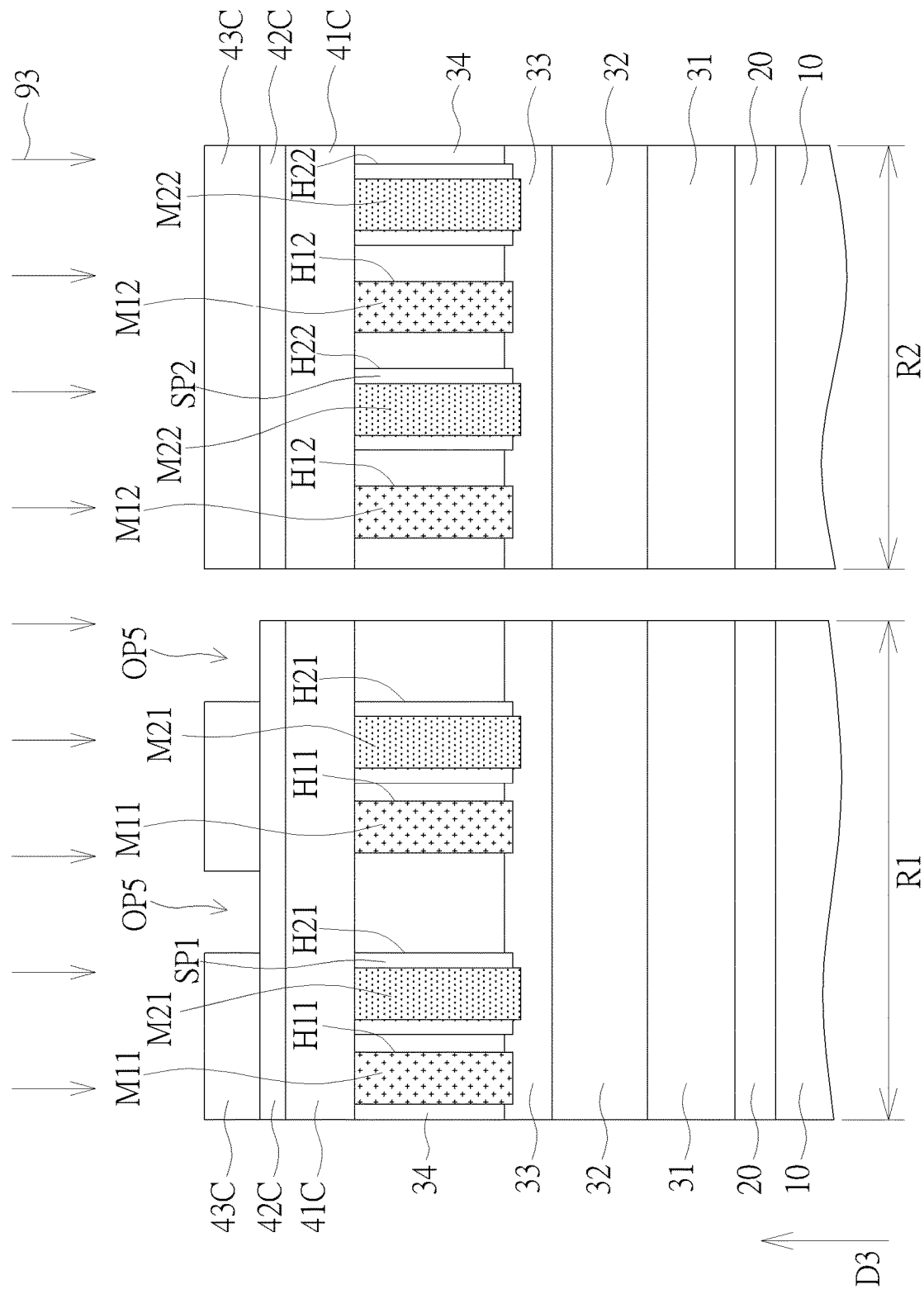
Figure 19:
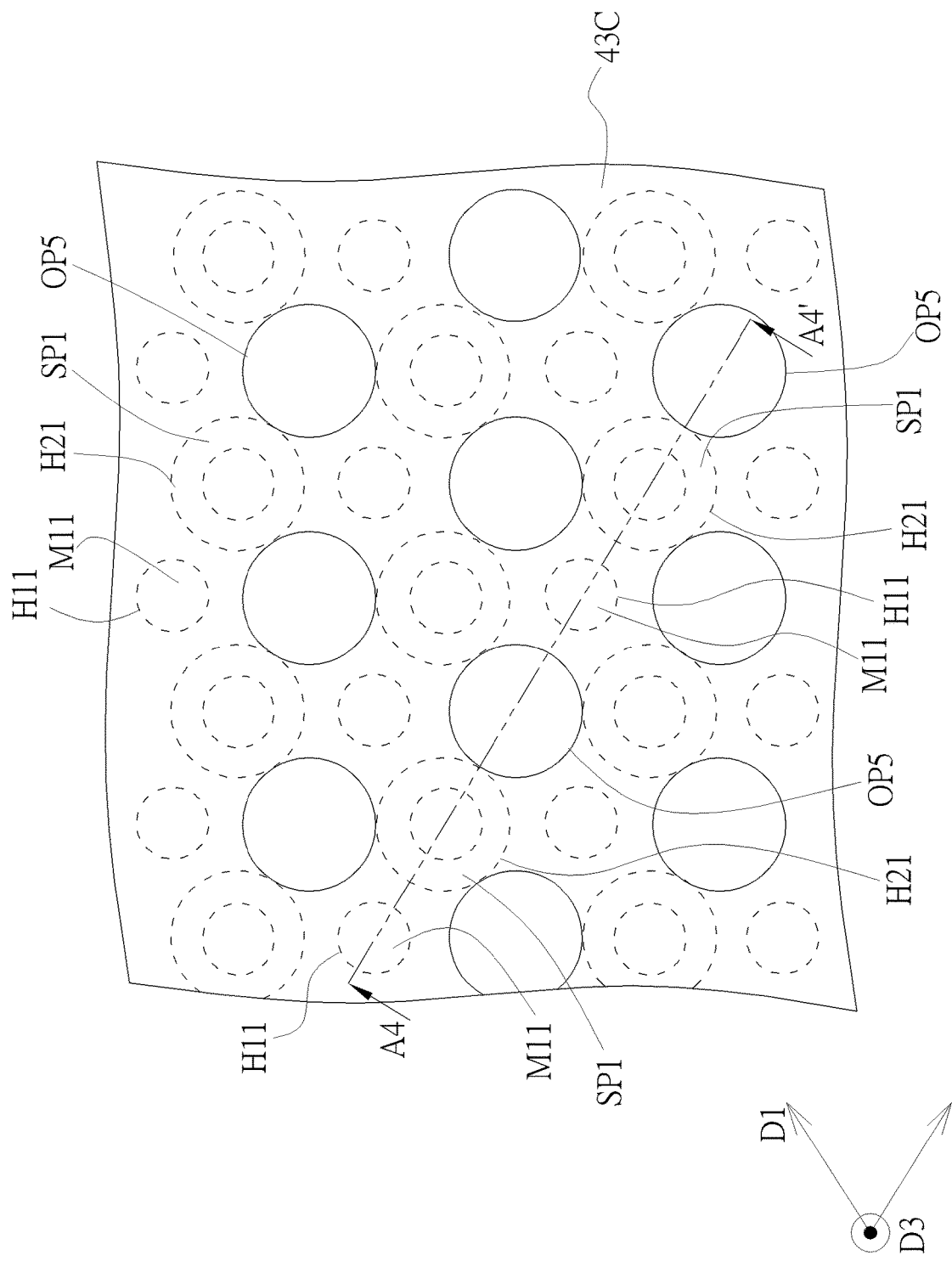
Figure 20:
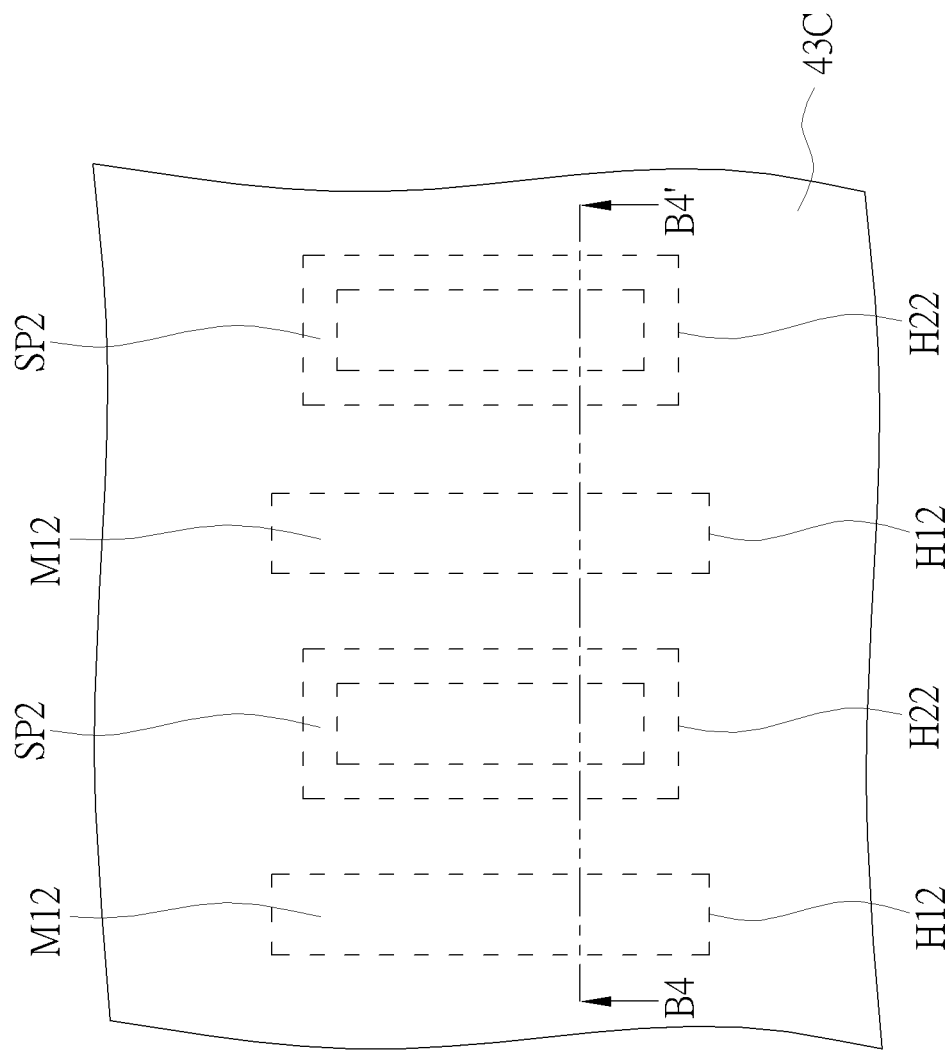

As shown in FIGS. 18-22, in some embodiments, the patterning method may further include performing a third photolithography process 93, a fifth hole H31 may be formed in the mask layer 34 by the third photolithography process 93, and the fifth hole H31 may be formed on the first region R1. In some embodiments, a third organic dielectric layer 41C, a third anti-reflection layer 42C, and a third patterned photoresist layer 43C may be sequentially formed on the mask layer 34. The third organic dielectric layer 41C may include an organic distribution layer, and the third anti-reflection layer 42C may include a silicon-containing hard mask bottom anti-reflecting coating, but not limited thereto. The third photolithography process 93 may include a photoresist coating process, an exposure process, and a develop process for forming the third patterned photoresist layer 43C, and an etching process using the third patterned photoresist layer 43C as a mask. The fifth hole H31 may be formed in the mask layer 34 by a fifth opening OP5 disposed on the first region R1 and disposed in the third patterned photoresist layer 43C and the etching process using the third patterned photoresist layer 43C in the third photolithography process 93. As shown in FIGS. 18-20, there is not any opening disposed in the third pattern photoresist layer 43C above the second region R2, and the mask layer 34 on the second region R2, the third mask pattern M12, the fourth mask pattern M22, and the second spacer SP2 may be covered by the third organic dielectric layer 41C, the third anti-reflection layer 42C, and the third patterned photoresist layer 43C during the third photolithography process 93, but not limited thereto. The third patterned photoresist layer 43C, the third anti-reflection layer 42C, and the third organic dielectric layer 41C may be removed after the step of forming the fifth hole H31.

Subsequently, a third spacer SP3 is formed on an inner wall of the fifth hole H31, a fifth mask pattern M31 is formed in the fifth hole H31 after the step of forming the third spacer SP3, and the third spacer SP3 surrounds the fifth mask pattern M31 in the fifth hole H31. The material and the manufacturing method of the third spacer SP3 may be the same as those of the first spacer SP1, and the material and the manufacturing method of the fifth mask pattern M31 may be the same as those of the second mask pattern M21, but not limited thereto. In some embodiments, the fifth hole H31 may be larger than the first hole H11, and the shape and the dimension of the fifth mask pattern M31 may be substantially equal to those of the first mask pattern M11 in the third direction D3 by controlling the process conditions of the step of forming the third spacer SP3, but not limited thereto. The fifth mask pattern M31 will not be directly connected with the first mask pattern M11 and/or the second mask pattern M21 when misalignments occur in the exposure process of the third photolithography process for forming the fifth hole H31 (the fifth hole H31 may overlap the first hole H11 and/or the second hole H21 in the third direction D3, for example) because the third spacer SP3 is formed in the fifth hole H31 before forming the fifth mask pattern M31. The manufacturing yield may be improved and the process window may be increased accordingly. Additionally, as shown in FIG. 3, in some embodiments, the first photolithography process described above may be performed in the step S11, the second photolithography process described above may be performed in the step S12, and the third photolithography process described above may be performed in the step S13. In other words, the second photolithography process may be performed after the first photolithography process, and the third photolithography process may be performed after the second photolithography process, but the present invention is not limited to this. In some embodiments, the sequence of the first photolithography process, the second photolithography process, and the third photolithography process described above may be adjusted according to some considerations.

As shown in FIGS. 21-24, the mask layer 34, the first spacer SP1, the second spacer SP2, and the third spacer SP3 are removed after the step of forming the fifth mask pattern M31. In some embodiments, the mask layer 34, the first spacer SP1, the second spacer SP2, and the third spacer SP3 may be removed concurrently by the same process when the materials of the mask layer 34, the first spacer SP1, the second spacer SP2, and the third spacer SP3 are similar to one another, but not limited thereto. In some embodiments, the mask layer 34, the first spacer SP1, the second spacer SP2, and the third spacer SP3 may also be removed by different processes respectively according to some considerations. An etching process 94 is then performed, and the pattern of the first mask pattern M11, the second mask pattern M21, the third mask pattern M12, the fourth mask pattern M22, and the fifth mask pattern M31 may be transferred to the material layer 20 by an etching process. In some embodiments, a plurality of the first mask pattern M11, a plurality of the second mask pattern M21, a plurality of the third mask pattern M12, a plurality of the fourth mask pattern M22, and a plurality of the fifth mask pattern M31 may be formed. The first mask patterns M11, the second mask patterns M21, and the third mask patterns M31 may be arranged in the first direction D1 and the second direction D2. One of the second mask patterns M21 and one of the fifth mask patterns M31 may be disposed between two of the first mask patterns M11 adjacent to each other in the first direction D1, and one of the second mask patterns M21 and one of the fifth mask patterns M31 may be disposed between two of the first mask patterns M11 adjacent to each other in the second direction D2.

Accordingly, the pattern of the first mask pattern M11, the second mask pattern M21, the third mask pattern M12, the fourth mask pattern M22, and the fifth mask pattern M31 may be transferred to the material layer 20 by the etching process for forming the first sub patterns P11, the second sub patterns P12, and the third sub patterns P13 in the first region R1 and forming fourth sub patterns P21 and fifth sub patterns P22 in the second region R2. The first sub patterns P11, the second sub patterns P12, and the third sub patterns P13 located in the first region R1 may form the first patterned structure PS1, and the fourth sub patterns P21 and the fifth sub patterns P22 located in the second region R2 may form a second patterned structure PS2. In other words, the first sub patterns P11 may be defined by using the first mask patterns M11 as an etching mask in the etching process 94 performed to the material layer 20, the second sub patterns P12 may be defined by using the second mask patterns M21 as an etching mask in the etching process 94 performed to the material layer 20, the third sub patterns P13 may be defined by using the fifth mask patterns M31 as an etching mask in the etching process 94 performed to the material layer 20, the fourth sub patterns P21 may be defined by using the third mask patterns M12 as an etching mask in the etching process 94 performed to the material layer 20, and the fifth sub patterns P22 may be defined by using the fourth mask patterns M22 as an etching mask in the etching process 94 performed to the material layer 20.

Figure 23:
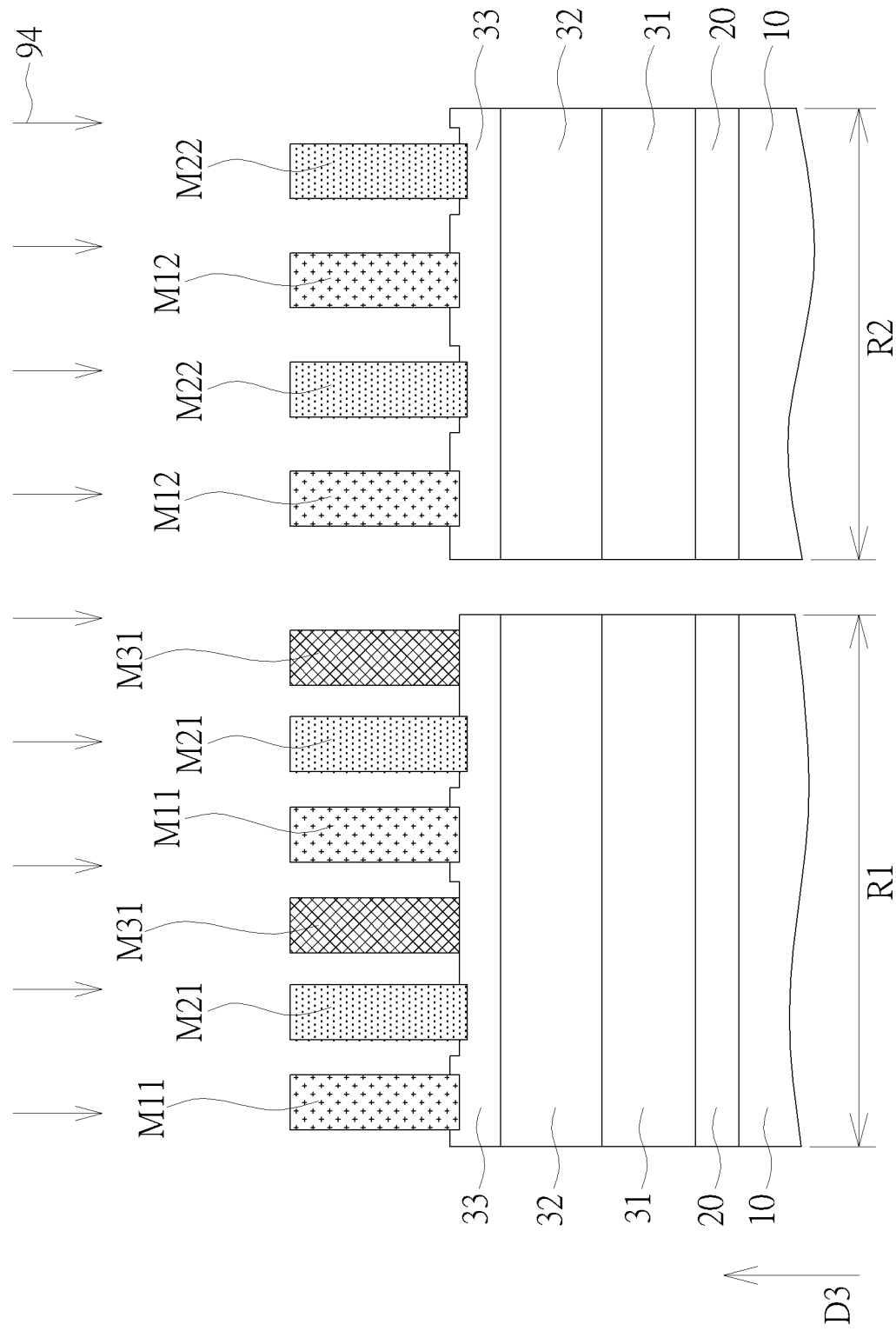
Figure 24:
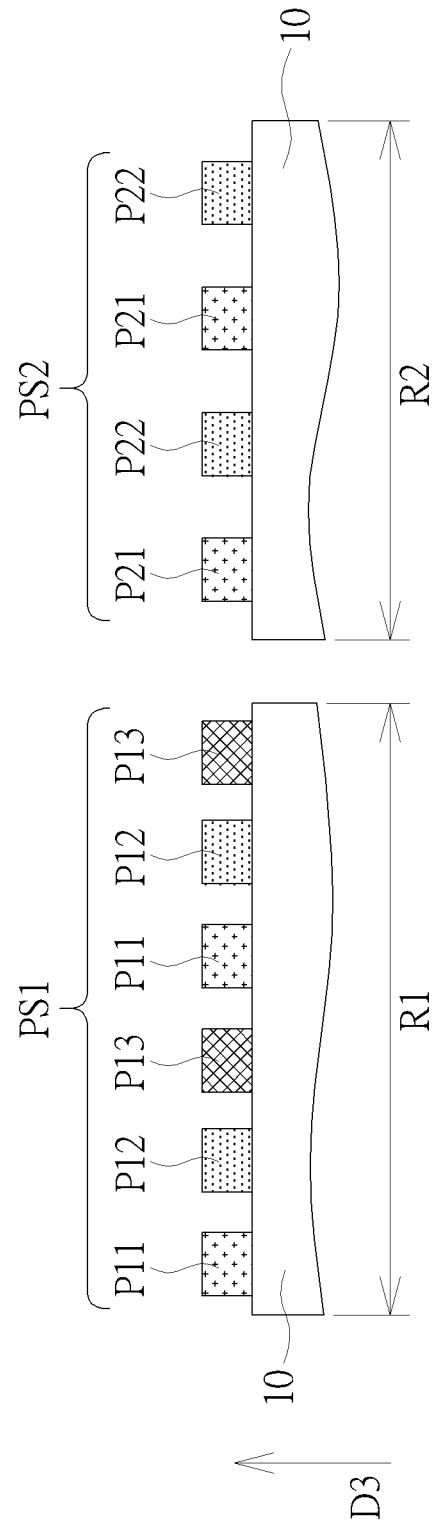

As shown in FIGS. 23-25, in some embodiments, the material layer 20 in the first region R1 may be patterned by the etching process 94 to become the storage node pads 20A in the first region R1, and the material layer 20 in the second region R2 may be patterned by the etching process 94 to become the connection structures 20B in the second region R2. In other words, the first sub patterns P11, the second sub patterns P12, and the third sub patterns P13 may be the storage node pads 20A in the semiconductor memory device 100, and the fourth sub patterns P21 and the fifth sub patterns P22 may be the connection structures 20B in the semiconductor memory device 100, but not limited thereto. When the spacing between the storage node pads 20A has to be extremely small according to design requirements, the layout pattern of the storage node pads 20A may be divided into three sets of layout combinations and the first photolithography process, the second photolithography process, and the third photolithography process described above may be performed with the three sets of layout combinations respectively for defining the required first mask patterns M11, the required second mask patterns M21, and the required fifth mask patterns M31 and overcoming the limitation of the exposure resolution in the photolithography processes. Additionally, the layout pattern of the connection structures 20B may be divided into two sets of layout combinations also, and the first photolithography process and the second photolithography process described above may be performed with the two sets of layout combinations respectively for defining the required third mask patterns M21 and the required fourth mask patterns M22. In other words, the manufacturing process of the connection structures 20B in the second region R2 may be integrated with the manufacturing process of the storage node pads 20A in the first region R1 for process simplification and manufacturing cost reduction.

Figure 21:
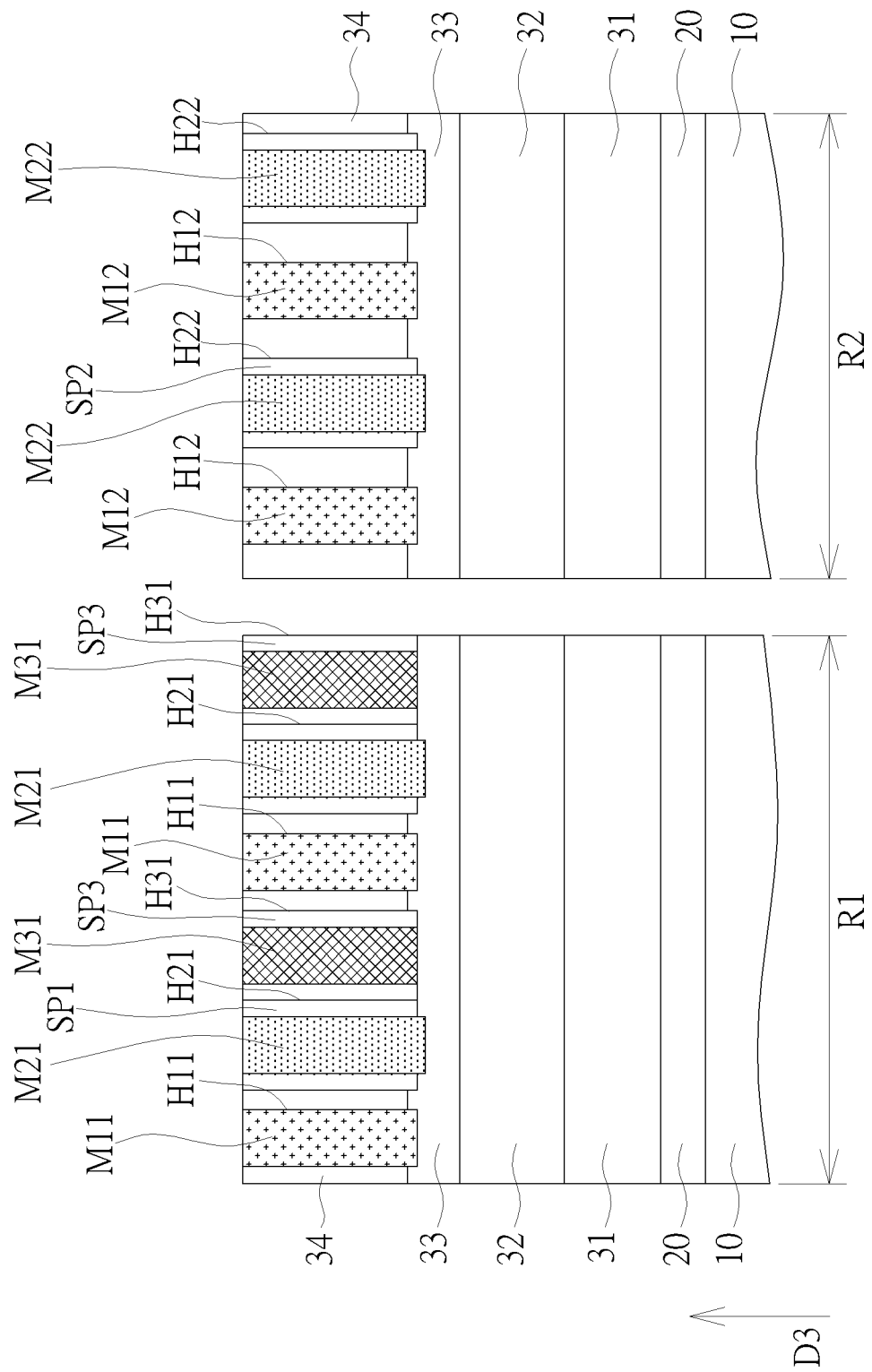
Figure 22:
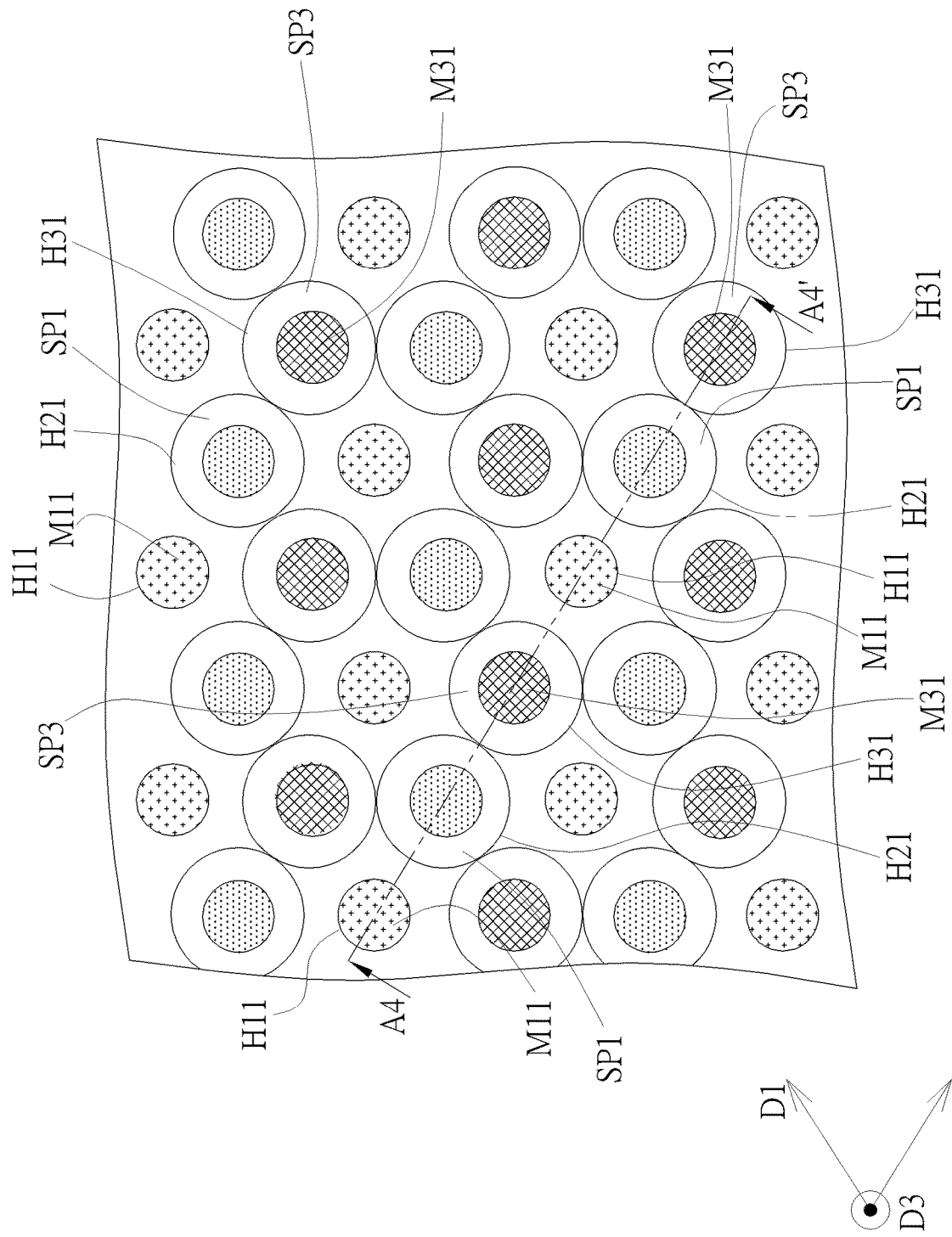
Figure 26:
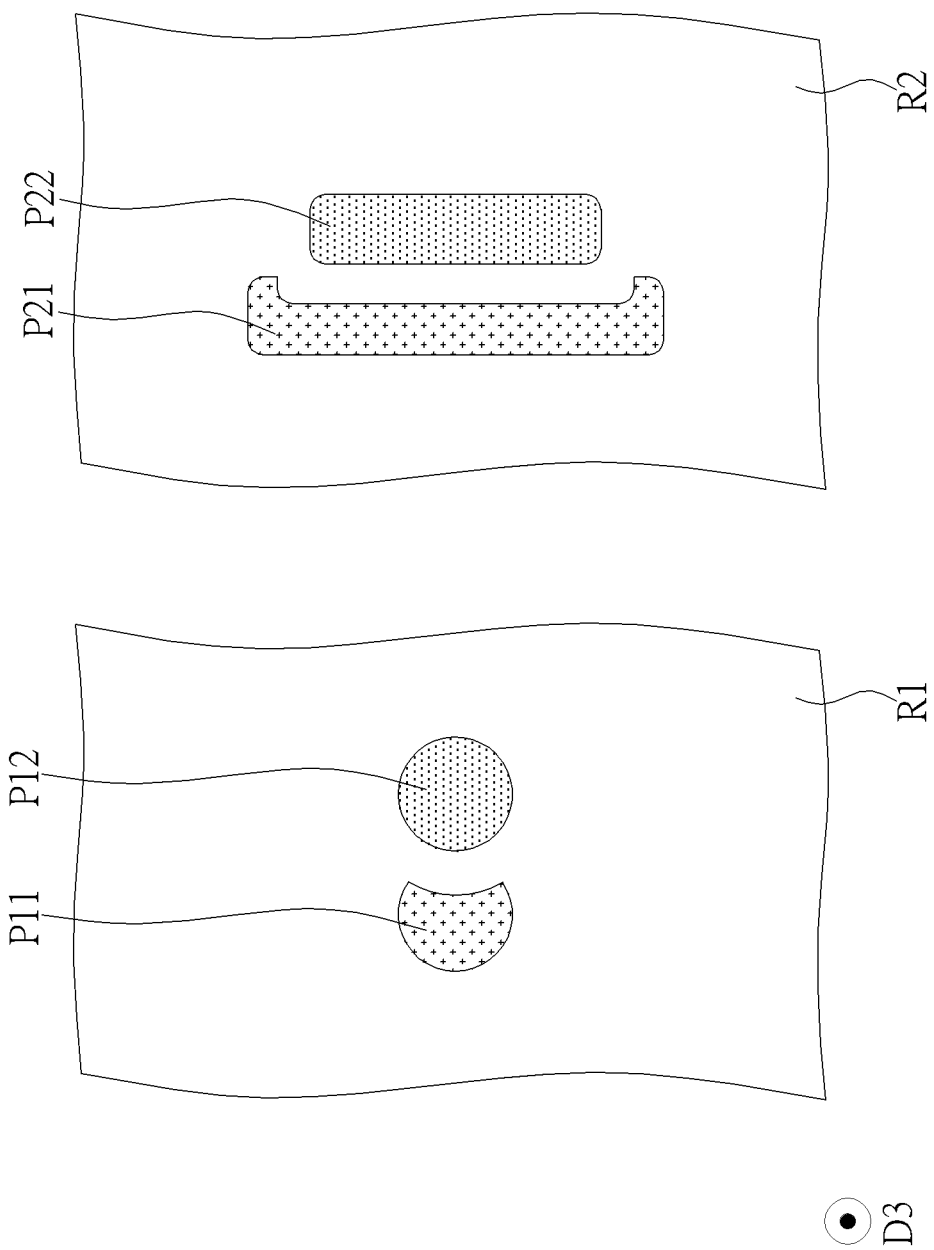
FIG. 26 is a schematic drawing illustrating a misalignment condition in the patterning method according to the first embodiment of the present invention.

Please refer to FIG. 21, FIG. 22, and FIG. 26. FIG. 26 is a schematic drawing illustrating a misalignment condition in the patterning method of this embodiment. As shown in FIG. 21 and FIG. 22, in the patterning method of the present invention, the second mask pattern M21 in the first region R1 will not be directly connected with the first mask pattern M11 and the fourth mask pattern M22 in the second region R2 will not be directly connected with the third mask pattern M12 when misalignments occur in the exposure process of the second photolithography process for forming the second hole H21 and the fourth hole H22 because the first spacer SP1 and the second spacer SP2 are formed in the second hole H21 and the fourth hole H22 respectively before the step of forming the second mask pattern M21 and the fourth mask pattern M22. Therefore, as shown in FIG. 21, FIG. 22, and FIG. 26, when misalignments occur in the exposure process mentioned above, the shape of the first sub pattern P11 defined by the first mask pattern M11 may be influenced by the first spacer SP1, but the first sub pattern P11 will not be connected with the second sub pattern P12. Additionally, the shape of the fourth sub pattern P21 defined by the third mask pattern M12 may be influenced by the second spacer SP2, but the fourth sub pattern P21 will not be connected with the fifth sub pattern P22 also.

Figure 27:
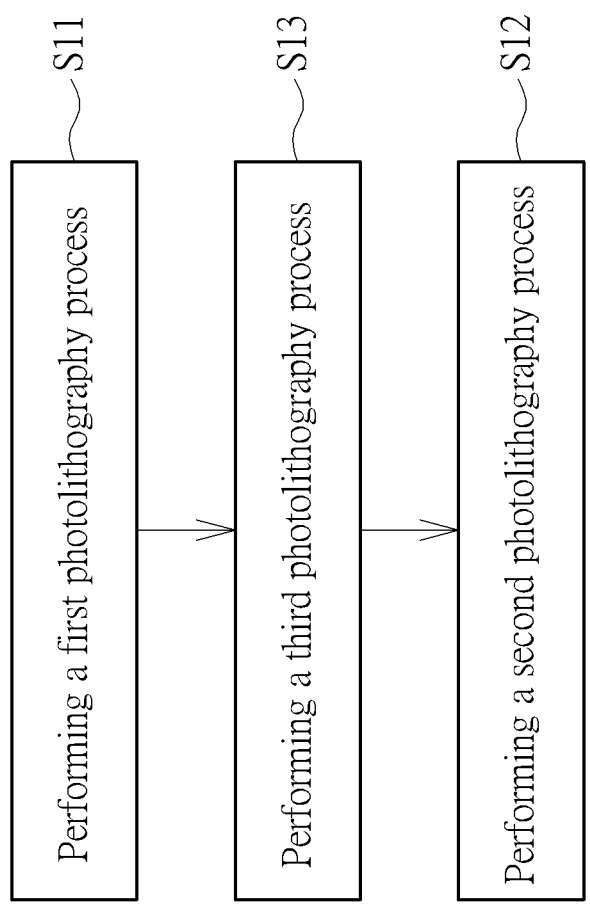
FIG. 27 is a flow chart of a patterning method according to a second embodiment of the present invention.

Please refer to FIG. 27. FIG. 27 is a flowchart of a patterning method according to a second embodiment of the present invention. As shown in FIG. 27, in some embodiments, the first photolithography process described above may be performed in the step S11, the third photolithography process described above may then be performed in the step S13 after the step S11, and the second photolithography process described above may be performed in the step S12 after the step S13. In other words, the second photolithography process may be performed after the first photolithography process, and the third photolithography process may be performed between the first photolithography process and the second photolithography process.

To summarize the above descriptions, according to the patterned structure and the patterning method of the present invention, the pattern of the patterned structure going to be formed may be divided into sets of layout combinations, and multiple photolithography processes may be used to form the required mask patterns for overcoming the problems in manufacturing the patterned structure with pattern spacing smaller than the exposure resolution. Additionally, in the patterning method of the present invention, the spacer may be formed in some of the holes before forming the mask pattern in the hole for avoiding the defects that the adjacent mask patterns are connected with each other when misalignments occur in the exposure process. The manufacturing yield may be improved and the process window may be increased accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
forming a mask layer on a material layer, wherein a first region and a second region are defined on the material layer;
forming a first hole in the mask layer by a first photolithography process;
forming a first mask pattern in the first hole;
forming a second hole in the mask layer by a second photolithography process, wherein the first hole and the second hole are formed on the first region;
forming a first spacer on an inner wall of the second hole;
forming a second mask pattern in the second hole after the step of forming the first spacer, wherein the first spacer surrounds the second mask pattern in the second hole;
forming a fifth hole in the mask layer by a third photolithography process, wherein the fifth hole is formed on the first region;
forming a third spacer on an inner wall of the fifth hole;
forming a fifth mask pattern in the fifth hole after the step of forming the third spacer, wherein the third spacer surrounds the fifth mask pattern in the fifth hole;
removing the mask layer, the first spacer, and the third spacer; and
transferring the pattern of the first mask pattern, the second mask pattern, and the fifth mask pattern to the material layer by an etching process.

2. The patterning method according to claim 1, wherein the second hole is larger than the first hole.

3. The patterning method according to claim 1, further comprising:
forming a third hole in the mask layer by the first photolithography process, wherein the third hole is formed on the second region, and the shape of the third hole is different from the shape of the first hole;
forming a third mask pattern in the third hole;
forming a fourth hole in the mask layer by the second photolithography process, wherein the fourth hole is formed on the second region, and the shape of the fourth hole is different from the shape of the second hole;
forming a second spacer on an inner wall of the fourth hole;
forming a fourth mask pattern in the fourth hole after the step of forming the second spacer, wherein the second spacer surrounds the fourth mask pattern in the fourth hole;
removing the second spacer; and
transferring the pattern of the third mask pattern and the fourth mask pattern to the material layer by the etching process.

4. The patterning method according to claim 3, wherein a width of the fourth hole is larger than a width of the third hole.

5. The patterning method according to claim 3, wherein the first spacer and the second spacer are formed concurrently by the same process.

6. The patterning method according to claim 3, wherein the first spacer and the second spacer are removed concurrently by the same process.

7. The patterning method according to claim 3, wherein the first region comprises a memory cell region, and the second region comprises a peripheral region.

8. The patterning method according to claim 7, wherein the material layer in the first region is patterned by the etching process to become storage node pads in the first region, and the material layer in the second region is patterned by the etching process to become connection structures in the second region.

9. The patterning method according to claim 1, wherein the fifth hole is larger than the first hole.

10. The patterning method according to claim 1, wherein the first spacer and the third spacer are removed concurrently by the same process.

11. The patterning method according to claim 1, wherein the second photolithography process is performed after the first photolithography process, and the third photolithography process is performed after the second photolithography process.

12. The patterning method according to claim 1, wherein the second photolithography process is performed after the first photolithography process, and the third photolithography process is performed between the first photolithography process and the second photolithography process.

13. A patterning method, comprising:
forming a mask layer on a material layer, wherein a first region and a second region are defined on the material layer;

forming a first hole and a third hole in the mask layer by a first photolithography process, wherein the shape of the third hole is different from the shape of the first hole;

forming a first mask pattern in the first hole;

forming a third mask pattern in the third hole;

forming a second hole and a fourth hole in the mask layer by a second photolithography process, wherein the first hole and the second hole are formed on the first region, the third hole and the fourth hole are formed on the second region, and the shape of the fourth hole is different from the shape of the second hole;

forming a first spacer on an inner wall of the second hole;

forming a second spacer on an inner wall of the fourth hole;

forming a second mask pattern in the second hole after the step of forming the first spacer, wherein the first spacer surrounds the second mask pattern in the second hole;

forming a fourth mask pattern in the fourth hole after the step of forming the second spacer, wherein the second spacer surrounds the fourth mask pattern in the fourth hole;

removing the mask layer, the first spacer, and the second spacer; and transferring the pattern of the first mask pattern, the second mask pattern, the third mask pattern, and the fourth mask pattern to the material layer by an etching process.

14. The patterning method according to claim 13, wherein the second hole is larger than the first hole.

15. The patterning method according to claim 13, wherein a width of the fourth hole is larger than a width of the third hole.

16. The patterning method according to claim 13, wherein the first spacer and the second spacer are formed concurrently by the same process.

17. The patterning method according to claim 13, wherein the first spacer and the second spacer are removed concurrently by the same process.

18. The patterning method according to claim 13, wherein the first region comprises a memory cell region, and the second region comprises a peripheral region.

19. The patterning method according to claim 18, wherein the material layer in the first region is patterned by the etching process to become storage node pads in the first region, and the material layer in the second region is patterned by the etching process to become connection structures in the second region.

* * * * *